(12) United States Patent
En Gad et al.

(10) Patent No.: US 10,379,945 B2
(45) Date of Patent: Aug. 13, 2019

(54) ASYMMETRIC ERROR CORRECTION AND FLASH-MEMORY REWRITING USING POLAR CODES

(71) Applicants: California Institute of Technology, Pasadena, CA (US); New Jersey Institute of Technology, Newark, NJ (US); New Mexico State University Technology Transfer Corporation, Las Cruces, NM (US); The Research Foundation for the State University of New York, Amherst, NY (US); The Texas A&M University System, College Station, TX (US)

(72) Inventors: Eyal En Gad, Pasadena, CA (US); Yue Li, Pasadena, CA (US); Joerg Kliewer, Newark, NJ (US); Michael Langberg, Clarence, NY (US); Anxiao Jiang, College Station, TX (US); Jehoshua Bruck, La Canada, CA (US)

(73) Assignees: CALIFORNIA INSTITUTE OF TECHNOLOGY, Pasadena, CA (US); THE TEXAS A & M UNIVERSITY SYSTEM, College Station, TX (US)

( * ) Notice: Subject to any disclaimer, the term of this patent is extended or adjusted under 35 U.S.C. 154(b) by 0 days.

(21) Appl. No.: 15/112,156

(22) PCT Filed: Jan. 14, 2015

(86) PCT No.: PCT/US2015/011430
§ 371 (c)(1),
(2) Date: Jul. 15, 2016

(87) PCT Pub. No.: WO2015/108995
PCT Pub. Date: Jul. 23, 2015

(65) Prior Publication Data
US 2016/0335156 A1 Nov. 17, 2016

Related U.S. Application Data

(60) Provisional application No. 61/928,749, filed on Jan. 17, 2014, provisional application No. 62/018,434, filed on Jun. 27, 2014.

(51) Int. Cl.
*G06F 11/10* (2006.01)
*G11C 11/56* (2006.01)
(Continued)

(52) U.S. Cl.
CPC ...... *G06F 11/1068* (2013.01); *G06F 11/1012* (2013.01); *G11C 29/52* (2013.01); *H03M 13/13* (2013.01); *H03M 13/154* (2013.01)

(58) Field of Classification Search
None
See application file for complete search history.

(56) References Cited

U.S. PATENT DOCUMENTS 8,085,592 B2   12/2011   Yun et al.
8,386,883 B2 *  2/2013   Franceschini ...... G11C 13/0002
                                                257/49
(Continued)

FOREIGN PATENT DOCUMENTS

EP      0900440 B1       7/2003
KR   1020160144960      12/2016
WO    2015/108995 A1     7/2015

OTHER PUBLICATIONS

International Search Report and Written Opinion, dated May 11, 2015, for International Application No. PCT/US2015/011430, 8 pages.
(Continued)

*Primary Examiner* — Justin R Knapp
(74) *Attorney, Agent, or Firm* — Kilpatrick Townsend & Stockton LLP

(57) ABSTRACT

Techniques are disclosed for generating codes for representation of data in memory devices that may avoid the block erasure operation in changing data values. Data values comprising binary digits (bits) can be encoded and decoded using the generated codes, referred to as codewords, such (Continued)

that the codewords may comprise a block erasure-avoiding code, in which the binary digits of a data message m can be encoded such that the encoded data message can be stored into multiple memory cells of a data device and, once a memory cell value is changed from a first logic value to a second logic value, the value of the memory cell may remain at the second logic value, regardless of subsequently received messages, until a block erasure operation on the memory cell. Similarly, a received data message comprising an input codeword, in which source data values of multiple binary digits have been encoded with the disclosed block erasure-avoiding code, can be decoded in the data device to recover an estimated source data message.

27 Claims, 9 Drawing Sheets

(51) Int. Cl.
  *G11C 29/52* (2006.01)
  *H03M 13/13* (2006.01)
  *H03M 13/15* (2006.01)

(56) References Cited

U.S. PATENT DOCUMENTS

| | | | | |
|---|---|---|---|---|
| 8,780,620 | B2* | 7/2014 | Jiang | G11C 11/5678 365/148 |
| 2013/0254466 | A1 | 9/2013 | Jiang et al. | |
| 2015/0248325 | A1* | 9/2015 | Calderbank | G06F 11/1048 714/768 |
| 2015/0293716 | A1* | 10/2015 | Jiang | H03M 13/13 711/154 |

OTHER PUBLICATIONS

International Preliminary Report on Patentability, dated Jul. 28, 2016, for International Application No. PCT/US2015/011430, 7 pages.
Gad, et al. "Rank-Modulation Rewrite Coding for Flash Memories" IEEE International Symposium on Information Theory (2003) pp. 704-708.
Jiang et al., "Making Error Correcting Codes Work for Flash Memory" Department of Computer Science and Engineering, Texas A&M University; Tutorial at Flash Memory Summit, (2013) 75 pages.

* cited by examiner

ASYMMETRIC ERROR CORRECTION AND FLASH-MEMORY REWRITING USING POLAR CODES

CROSS-REFERENCES TO RELATED APPLICATIONS

This application claims the benefit of International Application Ser. No. PCT/US2015/011430, filed on Jan. 14, 2015, entitled, "ASYMMETRIC ERROR CORRECTION AND FLASH-MEMORY REWRITING USING POLAR CODES", claims the benefit under 35 U.S.C. § 119(e) of U.S. Provisional Application Ser. No. 61/928,749 filed Jan. 17, 2014 entitled "POLAR CODING FOR NOISY WRITE-ONCE MEMORIES", and claims the benefit under 35 U.S.C. § 119(e) of U.S. Provisional Application Ser. No. 62/018,434 filed Jun. 27, 2014 entitled "POLAR CODING FOR NOISY WRITE-ONCE MEMORIES" which are incorporated herein by reference in their entirety for all purposes.

STATEMENT REGARDING FEDERALLY SPONSORED RESEARCH AND DEVELOPMENT

This invention was made with government support under Grant No. CIF1218005, Grant No. CCF1017632, Grant No. CCF1161774, Grant No. CCF1320785, and Grant No. CCF0747415 awarded by the National Science Foundation and under Grant No. 2010075 awarded by the US-Israel Binational Science Foundation. The government has certain rights in the invention.

BACKGROUND

Unless otherwise indicated herein, the materials described in this section are not prior art to the claims in this application and are not admitted to be prior art by inclusion in this section. The present disclosure relates generally to data storage devices, and to systems and methods for such devices. In various examples, data modulation techniques in data storage devices such as flash memory devices are described.

Flash memories are one type of electronic non-volatile memories (NVMs), accounting for nearly 90% of the present NVM market. Today, billions of flash memories are used in mobile, embedded, and mass-storage systems, mainly because of their high performance and physical durability. Example applications of flash memories include cell phones, digital cameras, USB flash drives, computers, sensors, and many more. Flash memories are now sometimes used to replace magnetic disks as hard disks.

A flash memory device includes memory cells that are capable of storing a voltage charge, either a memory cell level of logic "1" or a memory cell level of logic "0". That is, the cell voltage level corresponds to a logic level, or numeric representation of a binary digit. Changing the cell level (e.g., changing the cell voltage charge) changes the stored binary digit value. A limitation of conventional flash memories is the high cost of changing a cell voltage level from a first logic level to a second logic level, such as from logic "1" to logic "0". To perform such a change, a "block erasure" operation is performed. Block erasures are typically performed when the data value in a cell or group of cells is changed to represent new values. The block erasure is relatively expensive in terms of resource utilization, such as time and electrical power to perform the block erasure. Operation of flash memory devices would be more efficient if such block erasure resource demands were reduced.

SUMMARY

Disclosed are techniques for generating codes for representation of data values in data devices that avoid the block erasure operation in changing data values. More particularly, data values comprising binary digits (bits) can be encoded and decoded using data representation codes, referred to as codewords, such that the codewords comprise a block erasure-avoiding code. As described herein, a block erasure-avoiding code may be a code in which the binary digits of a data message m can be encoded such that the encoded data message can be stored into multiple memory cells of a data device and, once a memory cell value is changed from a first logic value to a second logic value, the value of the memory cell may remain at the second logic value, regardless of subsequently received messages, until a block erasure operation on the memory cell. More particularly, the codewords may be configured for representation by multiple cells of a memory device such that, once a cell value is changed from logic "0" to logic "1", the value of that cell may remain at logic "1", even if the corresponding stored data value is changed. This may avoid or otherwise reduce the need for block erasure for changing data values represented by the disclosed codewords. Similarly, a received data message comprising an input codeword, in which source data values of multiple binary digits have been encoded with the disclosed block erasure-avoiding code, can be decoded in the data device to recover an estimated source data message. Thus, a data message m can be received at a data device over a communications channel and can be processed in the device for encoding such that the binary digits of the message m represent a codeword of a block erasure-avoiding code, and a data message comprising an encoded plurality of binary digits can be decoded to recover the original source data binary digits.

The presently disclosed techniques are well-suited to the single-level cell (SLC) type of memory device, which is a type of memory cell that stores one of two cell charge levels, corresponding to logic "0" and logic "1". One example of a SLC memory device in accordance with this disclosure may receive a message over a communications channel and may encode the binary digits that make up the message, or the memory device may receive a codeword over the communications channel and may generate an estimated decoded codeword, to recover the original message. The disclosed techniques also work well with the multi-level cell (MLC) type of memory device, which is a type of device that utilizes memory cells that store multiple charge levels, typically four or eight charge levels.

Various examples describe efficient coding schemes that may include two communication settings: (1) an asymmetric channel setting, and (2) a channel with informed encoder setting. These communication settings may be utilized in non-volatile memories, as well as optical and broadcast communication. The present disclosure describes coding schemes that may be based on non-linear polar codes, where the described coding schemes may improve the performance of systems and devices that employ the above described communication setting topologies.

In the discussion below, it is shown that the block erasure-avoiding codes disclosed herein provide codewords that enable the data bit transfer rate of the communications channel over which the data messages are transmitted to be maximized or otherwise increased for the channel capacity.

That is, the disclosed block erasure-avoiding codes may provide the property of a code in which the binary digits of a data message m can be encoded such that the encoded data message can be stored into multiple memory cells of a data device and, once a memory cell value is changed from a first logic value to a second logic value, the value of the memory cell may remain at the second logic value, regardless of subsequently received messages, until a block erasure operation on the memory cell, but in addition, the disclosed block erasure-avoiding codes may be codes that enable data transfer over the communications channel to be at a maximum or otherwise increased channel capacity of the communications channel.

The foregoing summary is illustrative only and is not intended to be in any way limiting. In addition to the illustrative aspects, embodiments, techniques, systems, methods of operating, and features described above, further aspects, embodiments, techniques, systems, methods of operating, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, all of which are arranged according to at least some embodiments presented herein.

DETAILED DESCRIPTION

Figure 1:
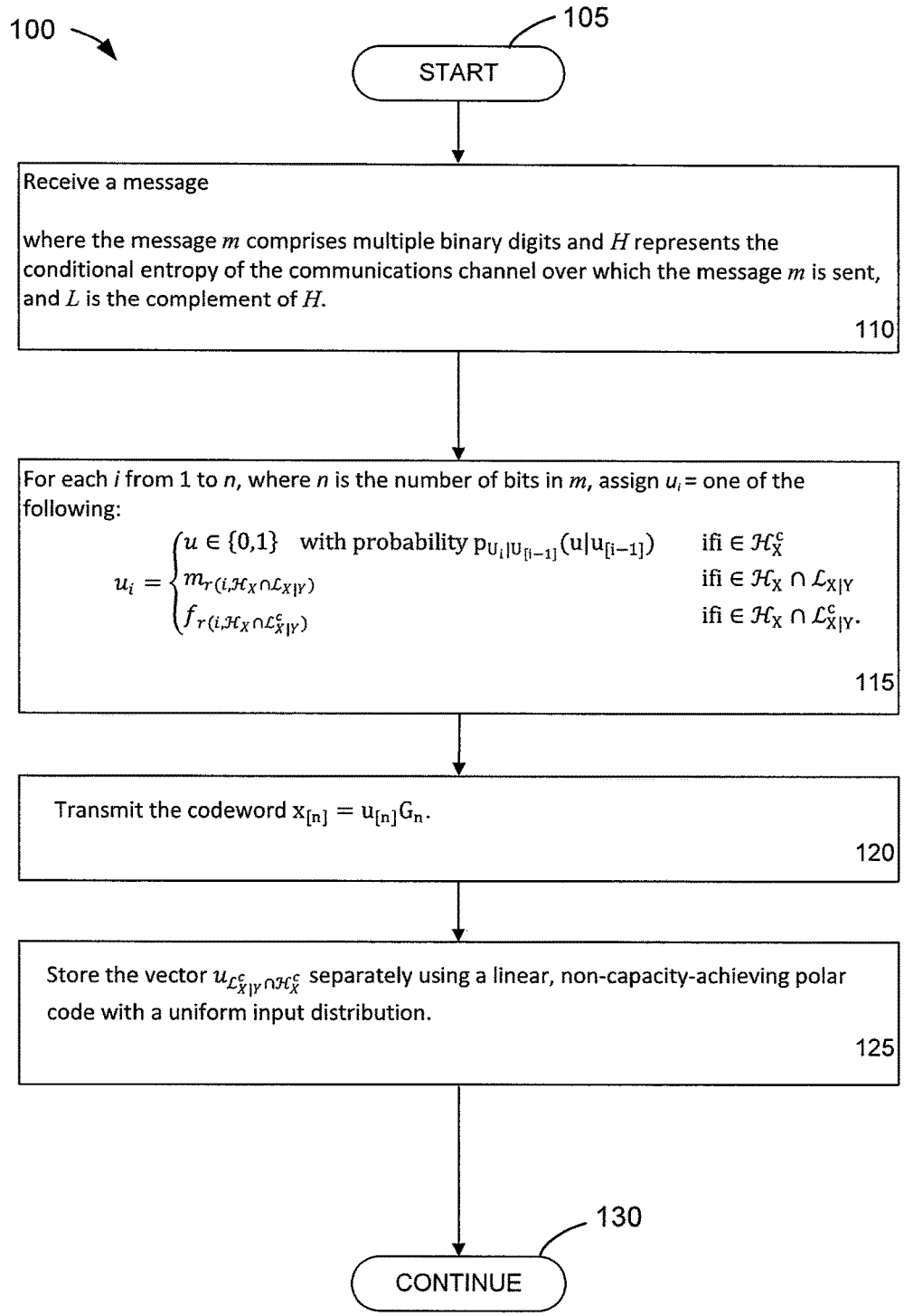
FIG. 1 is a flow diagram that illustrates operations that may be performed in a memory device constructed according to various examples for encoding a data message as disclosed herein.

The contents of this Detailed Description are organized under the following headings:
I. Introduction
   A. Error Correcting Codes and Flash Memories
   B. Relation to Previous Work
II. Asymmetric Point-to-Point Channels
III. Channels with Non-Causal Encoder State Information
   A. Special Cases
   B. Multicoding Construction for Degraded Channels
   C. Multicoding Construction Without Degradation
IV. Example Embodiments
Appendix A (proof of Theorem 6)
Appendix B (proof of Lemma 6a)
Appendix C (proof of Theorem 7)

I. Introduction

In the discussion below, error-correcting codes and flash memories are described generally, in this "Introduction" section. Section II, Asymmetric Point-to-Point Channels, considers asymmetric communications channels, in which codes for encoding and decoding data values accommodate the non-uniform input distribution of such communications channels. The parameters for a channel capacity-achieving code are discussed, and a code generating technique for such channels, referred to as "Construction A", is described. The derivation of the channel capacity-achieving code is explained in terms of known channel coding theorems (such as the Channel Coding Theorem and the Polarization Theorem) and Bhattacharyya parameters. In Section III, Channels with Non-Causal Encoder State Information, different channel capacity-achieving codes are described for use with communications channels for which channel state information is available. Such codes may be suited to the flash memory context, in which block erasure operations may be resource intensive and are to be avoided or reduced. Two particular code generating techniques are discussed for communications channels with channel state information, techniques referred to as "Construction B" and "Construction C" for convenience. In Section III, theorems and definitions in addition to those in Section II are used to derive the disclosed channel capacity-achieving codes. Section IV, Example Embodiments, discusses implementations of hardware and software that can carry out the techniques for encoding and decoding according to the description herein, including the Construction A, Construction B, and Construction C techniques.

A. Error Correcting Codes and Flash Memories

Asymmetric channel coding may be useful in various applications such as non-volatile memories, where the electrical mechanisms may be dominantly asymmetric (see, e.g., Y. Cassuto, M. Schwartz, V. Bohossian, and J. Bruck, "Codes For Asymmetric Limited-Magnitude Errors With Application To Multilevel Flash Memories", *IEEE Trans. On Information Theory*, Vol. 56, No. 4, pp. 1582-1595, April 2010). Asymmetric channel coding may also be useful in optical communications, where photons may fail to be detected (1→0) while the creation of spurious photons (0→1) may not be possible. Channel coding with informed encoder may also be useful for non-volatile memories, since the memory state in these devices may affect the fate of writing attempts. Channel coding with informed encoder may also be useful in broadcast communications, where channel coding may be used in the Marton's coding scheme to achieves high communication rates.

Various technical discussions in the present application may pertain to polar coding techniques. Polar coding techniques may be both highly efficient in terms of communication rate and computational complexity, and may be relatively easy to analyze and understand. Polar codes were introduced by Arikan (see, e.g., E. Arikan, "Channel Polarization: A Method For Constructing Capacity-Achieving Codes For Symmetric Binary-Input Memoryless Channels", *IEEE Trans. on Information Theory*, Vol. 55, No. 7, pp. 3051-3073, July 2009), achieving the symmetric capacity of binary-input memoryless channels.

Several polar coding schemes for asymmetric channels were proposed recently, including a pre-mapping using Gallager's scheme (R. G. Gallager, *Information Theory and Reliable Communication*, Wiley, 1968, p. 208) and a concatenation of two polar codes (D. Sutter, J. Renes, F. Dupuis, and R. Renner, "Achieving The Capacity Of Any DMC Using Only Polar Codes", in *Information Theory Workshop (ITW)*, 2012 IEEE, September 2012, pp. 114-118). A more direct approach was proposed in J. Honda and H. Yamamoto, "Polar coding without alphabet extension for asymmetric models", *IEEE Trans. on Information Theory*, Vol. 59, No. 12, pp. 7829-7838, 2013, which achieves the capacity of asymmetric channels using non-linear polar codes, but uses large Boolean functions that involve a storage space that is exponential in block length. The present disclosure describes a modification to this scheme, which removes the use of the Boolean functions, and may result in reduced storage requirement of the encoding and decoding tasks to a linear function of the block length.

The present disclosure further describes a generalization of the non-linear scheme to the availability of side information about the channel at the encoder. This scheme may be referred to as a polar multicoding scheme, which achieves the capacity of channels with an informed encoder. This scheme may be useful for non-volatile memories such as flash memories and phase change memories, and for broadcast channels.

One characteristic of flash memories is that the response of the memory cells to a writing attempt may be affected by the previous content of the memory. This complicates the design of error correcting schemes, and thus motivates flash systems to "erase" the content of the cells before writing, and by that to eliminate latency effects. However, the erase operation in flash memories may be resource-expensive, and therefore a simple coding scheme that does not involve erasure before writing may improve the performance of solid-state drives significantly. Described herein are two instances of the proposed polar multicoding scheme.

B. Relation to Previous Work

The study of channel coding with informed encoder was initiated by Kusnetsov and Tsybakov (A. Kusnetsov and B. S. Tsybakov, "Coding In A Memory With Defective Cells", *translated from Problemy Peredachi Informatsii*, Vol. 10, No. 2, pp. 52-60, 1974), with the channel capacity derived by Gelfand and Pinsker (see supra, Gelfand and Pinsker, "Coding For Channel With Random Parameters"). The informed encoding technique of Gelfand and Pinsker was used earlier by Marton to establish an inner bound for the capacity region of broadcast channels (K. Marton, "A Coding Theorem For The Discrete Memoryless Broadcast Channel", *IEEE Trans. on Information Theory*, Vol. 25, No. 3, pp. 306-311, May 1979). Low-complexity capacity-achieving codes were first proposed for continuous channels, using lattice codes (see, e.g., R. Zamir, S. Shamai, and U. Erez, "Nested Linear/Lattice Codes For Structured Multiterminal Binning", *IEEE Trans. On Information Theory*, Vol. 48, No. 6, pp. 1250-1276, June 2002). In discrete channels, the first low-complexity capacity-achieving scheme was proposed using polar code, for the symmetric special case of information embedding (see, e.g., S. Korada and R. Urbanke, "Polar Codes Are Optimal For Lossy Source Coding," *IEEE Trans. On Information Theory*, Vol. 56, No. 4, pp. 1751-1768, April 2010, Section VIII.B). A modification of this scheme for the application of flash memory rewriting was proposed in D. Burshtein and A. Strugatski, "Polar Write Once Memory Codes", *IEEE Trans. On Information Theory*, Vol. 59, No. 8, pp. 5088-5101, August 2013, considering a model called write-once memory. An additional scheme for this application, based on randomness extractors, was also proposed recently in A. Gabizon and R. Shaltiel, "Invertible Zero-Error Dispersers And Defective Memory With Stuck-At Errors", in *APPROX-RANDOM*, 2012, pp. 553-564.

Some aspects of the present disclosure is directed towards a setup that may be compared to those considered in Burshtein and Strugatski, "Polar Write Once Memory Codes", supra, and in A. Gabizon and R. Shaltiel, "Invertible Zero-Error Dispersers And Defective Memory With Stuck-At Errors", in *APPROX-RANDOM*, 2012, pp. 553-564. A contribution of the presently disclosed techniques compared to two mentioned schemes is that the schemes disclosed herein may achieve the capacity of rewriting model that also include noise, while the schemes described in Burshtein and Strugatski, "Polar Write Once Memory Codes" and in Gabizon and Shaltiel, "Invertible Zero-Error Dispersers And Defective Memory With Stuck-At Errors", may achieve the capacity of the noise-less case. Error correction is a useful capability in modern flash memory systems. The low-complexity achievability of the noisy capacity may be accomplished using a multicoding technique.

Comparing with Gabizon and Shaltiel, "Invertible Zero-Error Dispersers And Defective Memory With Stuck-At Errors", supra, the presently disclosed techniques may result in improved performance by achieving the capacity with an input cost constraint, which also is useful in rewriting models to maximize or otherwise increase the sum of the code rates over multiple rewriting rounds. Compared with Burshtein and Strugatski, "Polar Write Once Memory Codes", supra, the presently disclosed techniques may result in improved performance by removing or otherwise reducing the involvement of shared randomness between the encoder and decoder, which may affect the practical coding performance. The removal or reduction of the shared randomness may be accomplished by the use of non-linear polar codes. An additional coding scheme contemplated herein also does not involve shared randomness. See X. Ma, "Write-Once-Memory Codes By Source Polarization" (on-line, available at the Internet URL of [arxiv.org/abs/1405.6262], as of May 2014). However, the additional coding scheme in Ma, "Write-Once-Memory Codes By Source Polarization", supra, considers only the noise-less case.

Polar coding for channels with informed encoders was also studied recently in the context of broadcast channels, since the Marton coding technique contains the multicoding technique as an ingredient. A coding technique was recently presented for broadcast channels, in N. Goela, E. Abbe, and M. Gastpar, "Polar Codes For Broadcast Channels", in *Proc. IEEE Int. Symp. on Information Theory (ISIT)*, July 2013, pp. 1127-1131. The presently described techniques were developed independently and provide at least three new contributions that are not found, suggested, or otherwise described in Goela et al., "Polar Codes For Broadcast Channels", supra. First, by using the modified scheme of non-linear polar codes, the presently described techniques may result in reduced storage requirements from an exponential function in the block length to a linear function. Secondly, the presently disclosed schemes can be connected to the application of data storage and flash memory rewriting, which was not considered in the previous work. And thirdly, the analysis in Goela et al., "Polar Codes For Broadcast Channels," holds for channels that exhibit a certain technical condition of degradation. In the present disclosure, a rewriting model is considered with writing noise that exhibits the degradation condition, and it is shown herein that the scheme achieves the capacity of the considered model.

Another paper on polar coding for broadcast channel was published recently by Mondelli et. al.; see M. Mondelli, S. H. Hassani, I. Sason, and R. Urbanke, "Achieving Marton's Region For Broadcast Channels Using Polar Codes" (online, available at the Internet URL of [arxiv.org/abs/1401.6060], January 2014). That paper proposed a method, called "chaining", that allows bypassing of the condition of channel degradation. In the present disclosure, the chaining method is connected to the flash-memory rewriting application and to the new non-linear polar coding scheme disclosed herein, and is applied to the proposed multicoding scheme. This allows for a linear storage, together with the achievability of the informed encoder model and Marton's inner bound, eliminating or reducing the involvement of channel degradation. Furthermore, the present disclosure discusses the chaining scheme for the flash-memory application, and explains the applicability of this instance for flash-memory systems.

The next discussion section of the present disclosure proposes a non-linear polar coding scheme for asymmetric channels, which does not involve an exponential storage of Boolean functions. Further sections that follow will describe a polar multicoding scheme for channels with informed encoder, including special cases for the rewriting of flash memories.

II. Asymmetric Point-to-Point Channels

Notation:

For positive integers $m \le n$, let $[m: n]$ denote the set $\{m, m+1, \ldots, n\}$, and let $[n]$ denote the set $[1: n]$. Given a subset $\mathcal{A}$ of $[n]$, let $\mathcal{A}^c$ denote the complement of $\mathcal{A}$ with respect to $[n]$, where n is clear from the context. Let $x_{[n]}$ denote a vector of length n, and let $x_{\mathcal{A}}$ denote a vector of length $|\mathcal{A}|$ obtained from $x_{[n]}$ by deleting the elements with indices in $\mathcal{A}^c$.

Throughout this section, channels with binary input alphabets are considered. However, the results of this section can be extended to non-binary alphabets without much difficulty using the methods described in various examples, such as R. Mori and T. Tanaka, "Channel Polarization On Q-Ary Discrete Memoryless Channels By Arbitrary Kernels", in *IEEE Int. Symp. on Information Theory (ISIT)*, June 2010, pp. 894-898; W. Park and A. Barg, "Polar Codes For Q-Ary Channels, q=2r", *IEEE Trans. on Information Theory*, Vol. 59, No. 2, pp. 955-969, February 2013; A. Sahebi and S. Pradhan, "Multilevel Polarization Of Polar Codes Over Arbitrary Discrete Memoryless Channels", in *Communication, Control, and Computing (Allerton)*, 2011, 49th Annual Allerton Conference on Communication, Control, and Computing, September 2011, pp. 1718-1725; E. Sasoglu, I. Telatar, and E. Arikan, "Polarization For Arbitrary Discrete Memoryless Channels", in *Information Theory Workshop, 2009. ITW 2009. IEEE*, October 2009, pp. 144-148; and E. Sasoglu, "Polarization and Polar Codes," *Foundation Trends in Communications and Information Theory*, Vol. 8, No. 4, pp. 259-381, 2012 (online, available at the Internet URL of [dx.doi.org/10.1561/0100000041]). One aspect of polar coding is that polar coding can take advantage of the polarization effect of the Hadamard transform on the entropies of random vectors. Consider a binary-input memoryless channel model with an input random variable $X \in \{0,1\}$, an output random variable $Y \in \mathcal{Y}$, and a pair of conditional probability mass functions (pmfs) $p_{Y|X}(y|0), p_{Y|X}(y|1)$ on $\mathcal{Y}$. Let n be a power of 2 that denotes the number of channel uses, also referred to as the block length. The channel capacity may be considered as an upper bound on the rate in which the probability of decoding error can be made as small as desirable for large enough block length. In various examples, the channel capacity may be given by the mutual information of X and Y.

Theorem 1. (Channel Coding Theorem) (see T. M. Cover and, J. A. Thomas, *Elements of Information Theory* (2nd ed). Wiley, 2006, Chapter 7). The capacity of the discrete memory-less channel p(y|x) may be given by:

$$C = \max_{p(x)} I(X; Y).$$

The Hadamard transform may be a multiplication of the random vector $X_{[n]}$ over the field of cardinality 2 with the matrix $G_n = G^{\otimes \log_2 n}$, where $$G = \begin{pmatrix} 1 & 0 \\ 1 & 1 \end{pmatrix}$$

and $\otimes$ denotes the Kronecker power. In other words, $G_n$ can be described recursively for $n \ge 4$ by the block matrix:

$$G_n = \begin{pmatrix} G_{\frac{n}{2}} & 0 \\ G_{\frac{n}{2}} & G_{\frac{n}{2}} \end{pmatrix}.$$

One aspect in this discussion involves the behavior of the conditional entropy $H(U_i|U_{[i-1]}, Y_{[n]})$, for $i \in [n]$. The matrix $G_n$ may transform $X_{[n]}$ into a random vector $U_{[n]} = X_{[n]} G_n$, such that the conditional entropy $H(U_i|U_{[i-1]}, Y_{[n]})$ is polarized. For example, for a fraction of close to $H(X|Y)$ of the indices $i \in [n]$, the conditional entropy $H(U_i|U_{[i-1]}, Y_{[n]})$ is close to 1, and for almost all the rest of the indices, the conditional entropy $H(U_i|U_{[i-1]}, Y_{[n]})$ is close to 0. This result was shown by E. Arikan, "Channel Polarization", supra. The "polarization theorem" below expresses the polarization effect mathematically.

Theorem 2. (Polarization Theorem) (see E. Arikan, "*Source Polarization*", in *Proc. IEEE Int. Symp. on Information Theory (ISIT)*, 2010, pp. 899-903; Theorem, 1 supra). Let n, $U_{[n]}, X_{[n]}, Y_{[n]}$ be provided as above. For any $\delta \in (0,1)$, let the conditional entropy H as a function of X given Y be provided as:

$$H_{X|Y} \triangleq \{i \in [n]: H(U_i|U_{[i-1]}, Y_{[n]}) \in (1-\delta, 1)\},$$

and define a complementary function L as:

$$L_{X|Y} \triangleq \{i \in [n] : H(U_i|U_{[i-1]}, Y_{[n]}) \in (0, \delta)\}.$$

Then:

$$\lim_{n \to \infty} |H_{X|Y}|/n = H(X|Y) \text{ and } \lim_{n \to \infty} |L_{X|Y}|/n = 1 - H(X|Y).$$

This polarization effect can be used for the design of a coding scheme that may achieve the capacity of symmetric channels with a running time that is polynomial in the block length. The capacity of weakly symmetric channels can be achieved by a uniform distribution on the input alphabet, e.g., p(x)=½ (see, e.g., T. M. Cover and J. A. Thomas, *Elements of Information Theory* (2d ed.), Wiley, 2006, Theorem 5.2.1 therein). Weakly symmetric channels can be considered to have a uniform distribution on the output alphabet, where the conditional distributions of the output given different inputs may be permutations of each other. Since the input alphabet in this section may be considered binary, the capacity-achieving distribution gives H(X)=1, and therefore equation (1) below follows:

$$\lim_{n \to \infty} (1/n)|L_{X|Y}| = 1 - H(X|Y) \qquad (1)$$
$$= H(X) - H(X|Y)$$
$$= I(X; Y).$$

For each index in $L_{X|Y}$, the conditional probability $p(u_i|u_{[i-1]}, y_{[n]})$ may be close to either 0 or 1 (since the conditional entropy may be small by the definition of the set $L_{X|Y}$). It follows that the random variable $U_i$ can be estimated reliably given $u_{[i-1]}$ and $y_{[n]}$. These realizations may be utilized to achieve various coding schemes that follow. The encoder may create a vector $u_{[n]}$ by assigning the subvector $U_{L_{X|Y}}$ with the source message, and the subvector $U_{L_{X|Y}^c}$ with uniformly distributed random bits that are shared with the decoder. The randomness sharing may be useful for analysis, but it will be shown to be unnecessary by the probabilistic method. Equation (1) implies that the described coding scheme may achieve the channel capacity. Decoding may be performed iteratively, from index 1 up to n. In each iteration, the decoder may estimate the bit $u_i$ using the shared information or a maximum likelihood estimation, according to the set membership of the iteration. The estimations of the bits $u_i$ for which i is in $L_{X|Y}^c$ may be successful, since these bits were known to the decoder in advance. The rest of the bits may be estimated correctly with relatively high probability, leading to a satisfactory decoding of the entire message with high probability.

However, this reasoning may not translate directly to asymmetric channels. A capacity-achieving input distribution of asymmetric channels may, in general, not be uniform (see, for example, S. Golomb, "The limiting behavior of the z-channel (corresp.)", *IEEE Trans. on Information Theory*, Vol. 26, No. 3, pp. 372-372, May 1980, e.g., $p_X(1) \neq \frac{1}{2}$. Since the Hadamard transform may be bijective, it follows that the capacity-achieving distribution of the polarized vector $U_{[n]}$ may be non-uniform as well. One possible problem is that assigning uniform bits of message or shared randomness may change the distribution of $U_{[n]}$, and consequently also may change the conditional entropies $H(U_i|U_{[i-1]}, Y_{[n]})$ (also note the probability chain rule $p(u_{[n]}) = \prod_{i \in [n]} p(u_i|u_{[i-1]}))$.

To manage this above-described situation, the change in the distribution of $U_{[n]}$ may be kept to be minor, and thus its effect on the probability of decoding error may also be minor. To achieve this, the conditional entropies $H(U_i|U_{[i-1]})$ for $i \in [n]$ may be considered. Since polarization may happen regardless of the transition probabilities of the channel, a noiseless channel may be considered, for which the output Y is a deterministic variable, and for which it may be concluded by Theorem 2 that the entropies $H(U_i|U_{[i-1]})$ may also be polarized. For this polarization, a fraction of H(X) of the indices may admit a high entropy $H(U_i|U_{[i-1]})$. To result in a minor or otherwise reduced change in the distribution of $U_{[n]}$, the assignments of uniform bits of message and shared randomness can be restricted to the indices with high entropy $H(U_i|U_{[i-1]})$.

A modified coding scheme may be implemented as a result of the above-described observations. The locations with high entropy $H(U_i|U_{[i-1]})$ may be assigned with uniformly distributed bits, while the rest of the locations may be assigned with the probability mass function (pmf) of $p(u_i|u_{[i-1]})$. Similar to the notation of Theorem 2, the set of indices with high entropy $H(U_i|U_{[i-1]})$ may be denoted by $H_X$. To achieve a reliable decoding, the message bits may be placed in the indices of $H_X$ that can be decoded reliably, such that that their entropies $H(U_i|U_{[i-1]}, Y_{[n]})$ are low. The message bits may be placed in the intersection $H_X \cap L_{X|Y}$. The locations whose indices are not in $L_{X|Y}$ may be known by the decoder in advance for a reliable decoding. Previous work suggested sharing random Boolean functions between the encoder and the decoder, drawn according to the pmf $p(u_i|u_{[i-1]})$, and to assign the indices in $L_X$ according to these functions. See, e.g., Goela and Gastpar, "Polar Codes For Broadcast Channels", supra; Honda and Yamamoto, "Polar Coding Without Alphabet Extension For Asymmetric Models", supra. However, the present disclosure contemplates that the storage required for those Boolean functions may be exponential in n, and therefore the present disclosure proposes an efficient alternative.

To avoid the Boolean function, the complement of $H_X \cap L_{X|Y}$ can be divided into three disjoint sets. First, the indices in the intersection $H_X \cap L_{X|Y}^c$ may be assigned with uniformly distributed random bits that can be shared between the encoder and the decoder. As in the symmetric case, this randomness sharing will not be necessary. The rest of the bits of $U_{[n]}$ (those in the set $H_X^c$), may be assigned randomly to a value u with probability $p_{U_i|U_{[i-1]}}(u|u_{[i-1]})$ (where $p_{U_i|U_{[i-1]}}$ is calculated according to the pmf $p_{U_{[n]}, X_{[n]}, Y_{[n]}}$, the capacity-achieving distribution of the channel). The indices in $H_X^c \cap L_{X|Y}$ could be decoded reliably, but not those in $H_X^c \cap L_{X|Y}^c$. Fortunately, the set $H_X^c \cap L_{X|Y}^c$ can be shown to be small, and thus those locations separately may have a vanishing or otherwise reduced effect on the code rate.

It can be seen that the code rate approaches the channel capacity by considering that the source message is placed in the indices in the intersection $H_X \cap L_{X|Y}$. The asymptotic fraction of this intersection can be derived as the following:

$$|H_X \cap L_{X|Y}|/n = 1 - |H_X^c \cup L_{X|Y}^c|/n = 1 - |H_X^c|/n - |L_{X|Y}^c|/n + |H_X^c \cap L_{X|Y}^c|/n. \qquad (2)$$

The Polarization Theorem (Theorem 2) implies that $|H_X^c|/n \to 1 - H(X)$ and $|L_{X|Y}^c|/n \to H(X|Y)$. Since the fraction $|H_X^c \cap L_{X|Y}^c|$ may vanish for large n, the asymptotic rate can be seen to be $|H_X \cap L_{X|Y}|/n \to H(X) - H(X|Y) = I(X;Y)$, achieving the channel capacity.

For a more precise definition of the scheme, the so-called Bhattacharyya parameter may be utilized in the selection of subsets of $U_{[n]}$, instead of the conditional entropy. The Bhattacharyya parameters may be polarized in a similar manner to the entropies, and may be useful for bounding the probability of decoding error. For a discrete random variable Y and a Bernoulli random variable X, the Bhattacharyya parameter Z may be provided by:

$$Z(X|Y) \triangleq 2\Sigma_y \sqrt{p_{X,Y}(0,y)p_{X,Y}(1,y)}. \quad (3)$$

Note that various polar coding literature may use a slightly different definition for the Bhattacharyya parameter, which may coincide with Equation (3) when the random variable X is distributed uniformly. The Bhattacharyya parameter can be thought of as an estimate to both the entropy H(X|Y) and the probability of decoding error. The following relationship between the Bhattacharyya parameter and the conditional entropy may be observed, as stated in Proposition 1 below.

Proposition 1. (see E. Arikan, "*Source Polarization*", in *Proc. IEEE Int. Symp. on Information Theory (ISIT)*, 2010, pp. 899-903; Proposition 2).

$$(Z(X|Y))^2 \leq H(X|Y), \quad (4)$$

$$H(X|Y) \leq \log_2(1 + Z(X|Y)) \leq Z(X|Y). \quad (5)$$

The set of high and low Battacharyya parameters ($\mathcal{H}_{X|Y}$ and $\mathcal{L}_{X|Y}$, respectively) may be provided, and may be utilized instead of the sets $H_{X|Y}$ and $L_{X|Y}$. For $\delta \in (0,1)$, the following may be provided:

$$\mathcal{H}_{X|Y} \triangleq \{i \in [n] : Z(U_i | U_{[i-1]}, Y_{[n]}) \geq 1 - 2^{-n^{1/2-\delta}}\},$$

$$\mathcal{L}_{X|Y} \triangleq \{i \in [n] : Z(U_i | U_{[i-1]}, Y_{[n]}) \leq 2^{-n^{1/2-\delta}}\}.$$

As before, the sets $\mathcal{H}_X$ and $\mathcal{L}_X$ for the parameter Z $(U_i | U_{[i-1]})$ may be provided by letting $Y_{[n]}$ be a deterministic variable.

A uniformly distributed source message m may be realized as $m_{[|\mathcal{H}_X \cap \mathcal{L}_{X|Y}|]} \in \{0,1\}^{|\mathcal{H}_X \cap \mathcal{L}_{X|Y}|}$ and a deterministic vector f that is known to both the encoder and decoder can be realized as $f_{[|\mathcal{H}_X \cap \mathcal{L}_{X|Y}^c|]} \in \{0,1\}^{|\mathcal{H}_X \cap \mathcal{L}_{X|Y}^c|}$. For a subset $\mathcal{A} \subseteq [n]$ and an index $i \in \mathcal{A}$, a function $r(i, \mathcal{A})$ can be utilized to denote the rank of i in an ordered list of the elements of $\mathcal{A}$. The probabilities $p_{U_i|U_{[i-1]}}(u|u_{[i-1]})$ and $p_{U_i|U_{[i-1]},Y^n}(u|u_{[i-1]}, y_{[n]})$ can be calculated by a recursive method as described in Honda and Yamamoto, "Polar Coding Without Alphabet Extension For Asymmetric Models", supra; see Section III.B below (*Multicoding Construction for Degraded Channels*).

Construction A.

This section describes a construction, called "Construction A" for ease of subsequent reference, that provides example operations for encoding and decoding schemes suited for asymmetric channels to produce codewords as output of encoding a message and to produce an estimated message as output of decoding an input codeword.

Example Message Encoding Scheme

Input: a message $m_{[|\mathcal{H}_X \cap \mathcal{L}_{X|Y}|]} \in \{0,1\}^{|\mathcal{H}_X \cap \mathcal{L}_{X|Y}|}$.
Output: a codeword $x_{[n]} \in \{0,1\}^n$.
1) For i from 1 to n, successively, set:

$$u_i = \begin{cases} u \in \{0,1\} \text{ with probability } p_{U_i|U_{[i-1]}}(u|u_{[i-1]}) & \text{if } i \in \mathcal{H}_X^c \\ m_{r(i,\mathcal{H}_X \cap \mathcal{L}_{X|Y})} & \text{if } i \in \mathcal{H}_X \cap \mathcal{L}_{X|Y} \\ f_{r(i,\mathcal{H}_X \cap \mathcal{L}_{X|Y}^c)} & \text{if } i \in \mathcal{H}_X \cap \mathcal{L}_{X|Y}^c \end{cases}.$$

2) Transmit the codeword $x_{[n]} = u_{[n]} G_n$.
3) Transmit the vector $u_{\mathcal{L}_{X|Y}^c \cap \mathcal{H}_X^c}$ separately using a linear, non-capacity-achieving polar code with a uniform input distribution.

Example Input Decoding Scheme

Input: a noisy vector $y_{[n]} \in \{0,1\}^n$.

Output: a message estimation $\hat{m}_{[|\mathcal{H}_X \cap \mathcal{L}_{X|Y}|]} \in \{0,1\}^{|\mathcal{H}_X \cap \mathcal{L}_{X|Y}|}$ 1) Estimate the vector $u_{\mathcal{L}_{X|Y}^c \cap \mathcal{H}_X^c}$ by $\hat{u}_{\mathcal{L}_{X|Y}^c \cap \mathcal{H}_X^c}$
2) For i from 1 to n, set:

$$\hat{u}_i = \begin{cases} \text{argmax}_{u \in \{0,1\}} p_{U_i|U_{[i-1]},Y_{[n]}}(u|u_{[i-1]}, y_{[n]}) & \text{if } i \in \mathcal{L}_{X|Y} \\ \hat{u}_{r(i,\mathcal{L}_{X|Y}^c \cap \mathcal{H}_X^c)} & \text{if } i \in \mathcal{L}_{X|Y}^c \cap \mathcal{H}_X^c \\ f_{r(i,\mathcal{H}_X \cap \mathcal{L}_{X|Y}^c)} & \text{if } i \in \mathcal{L}_{X|Y}^c \cap \mathcal{H}_X \end{cases}.$$

3) Return the estimated message $\hat{m}_{[|\mathcal{H}_X \cap \mathcal{L}_{X|Y}|]} = \hat{u}_{\mathcal{H}_X \cap \mathcal{L}_{X|Y}}$ Example properties of interest in this above-described scheme of Construction A may be the capacity achieved and the low algorithmic complexity. A sequence of coding schemes is said to achieve the channel capacity if the probability of decoding error vanishes or is otherwise reduced with the block length for any rate below the capacity. Theorem 3 below is proposed from observation of the schemes of Construction A above.

Theorem 3. Construction A with the example encoding and decoding schemes described above achieves the channel capacity (Theorem 1) with low computational complexity.

In the next section, a generalized construction is illustrated along with demonstration of its capacity-achieving properties. Theorem 3 thus follows as the corollary of the more general theorem.

III. Channels with Non-Causal Encoder State Information

In this section, Construction A is generalized to the availability of channel state information at the encoder. Rewriting in flash memories is considered, and two example cases of the model for this application are presented. The assumption of a memoryless channel may not be very accurate in flash memories, due to a mechanism of cell-to-cell interference, but the assumption is nonetheless useful for the design of coding schemes with valuable practical performance. One characteristic of flash memories that is considered in this disclosure is the high cost of changing a data cell level from "1" to "0" (in single-level cells). To perform such a change, an operation, called a "block erasure", may be implemented. Rewriting can be considered, so as to avoid the block erasure operation. For instance, a writing attempt on a cell with level "1" may not affect the cell level since this is not an erasure operation. In a communication terminology, the channel can be considered as having a discrete state. The state can be considered as "memoryless", for example the state of different cells can be distributed independently. This assumption may not be completely accurate, since the memory state in rewriting schemes may be determined by the previous write to the memory, in which the codeword indices may not be necessarily distributed independently. However, since capacity-achieving codes can be utilized, the independently and identically distributed (i.i.d.) assumption may be a reasonable approximation to the behavior of the different Bernoulli random variables that represent the cell outputs.

The state of all n cells may be assumed as available to the writer prior to the beginning of the writing process. In communication terminology this kind of state availability may be referred to as "non-causal". This setting may also be useful in the Marton coding method for communication over broadcast channels. Therefore, the multicoding schemes that will follow may serve as a contribution also in this setting. One example case of the model that is considered is the noise-less write-once memory model. The described model may also serve as a basis for a type of code called "rank-modulation rewriting codes" (see, e.g., E. En Gad, E. Yaakobi, A. Jiang, and J. Bruck, "Rank-Modulation Rewrite Coding For Flash Memories" (online, available at the URL of [//arxiv.org/abs/1312.0972], as of December 2013). Therefore, the schemes proposed in the present disclosure may also be useful for the design of rank-modulation rewriting codes.

The channel state can be represented as a Bernoulli random variable S with parameter λ, denoting to the probability p(S=1). As noted above, a cell of state "1" (e.g., logic "1") can be written to a value of "1" (avoiding block erasure). When the parameter λ is high, the capacity of the memory may be small, since only a few cells may be available for modification in the writing process, and thus a small amount of information may be stored. As a result, the capacity of the memory in future writes may be affected by the choice of codebook. A codebook that contains many codewords of high Hamming weight might may make the parameter λ of future writes high, and thus the capacity of the future writes might be low. However, forcing the expected Hamming weight of the codebook to be low might reduce the capacity of the current write. To settle this trade-off, the sum of the code rates over multiple writes can be adjusted to achieve a balanced result. In many cases, constraints on the codebook weight may strictly increase the sum rate (see, for example, C. Heegard, "On The Capacity Of Permanent Memory", in *IEEE Trans. Information Theory*, Vol. 31, No. 1, pp. 34-42, January 1985). Therefore, an input cost constraint may be considered in the model described herein.

A general model considered herein may be a discrete memoryless channel with a discrete memoryless state and an input cost constraint, when the state information is available non-causally at the encoder. The channel input, state and output may be denoted by x, s and y, respectively, and their respective finite alphabets may be denoted by $X, \mathcal{S}$, and $\mathcal{Y}$. The random variables may be denoted by X, S and Y, and the random vectors by $X_{[n]}$, $S_{[n]}$, and $Y_{[n]}$, where n is the block length. The state may be considered as distributed according to the probabilistic mass function (pmf) p(s), and the conditional pmf's of the channel may be denoted by p(y|x, s). The input cost constraint can be represented as:

$$\sum_{i=1}^{n} E[b(X_i)] \le nB.$$

The channel capacity with informed encoder and an input cost constraint can be determined by an extension of the Gelfand-Pinsker Theorem (see, e.g., A. El Gamal and Y. Kim, *Network Information Theory*, Cambridge University Press, 2012, Equation 7.7 at p. 186). The cost constraint may be defined slightly differently in the Gamal reference, but the capacity may not be substantially affected by the change.

Theorem 4. (Gelfand-Pinsker Theorem with Cost Constraint) (see, e.g., *Gamal and Kim, Network Information Theory*, Equation (7.7) at p. 186, supra). The capacity of a discrete memoryless channel (DMC) with a DM state p(y|x, s)p(s), and an input cost constraint B, when the state information is available non-causally only at the encoder, is given by:

$$C = \max_{p(v|s), x(v,s): E(b(X)) \le B} (I(V;Y) - I(V;S)) \qquad (6)$$

where V may be an auxiliary random variable with a finite alphabet v, $|v| \le \min\{|X \cdot \mathcal{S} \, \mathcal{Y} + \mathcal{S} - 1\}$.

An example coding scheme described herein may achieve the capacity stated in Theorem 4. Similar to the previous section, the treatment may be applicable to the case in which the auxiliary random variable V is binary. In flash memory, this case may correspond to a single-level cell (SLC) type of memory. As mentioned in Section II above, Asymmetric Point-To-Point Channels, an extension of the described scheme to a non-binary case (which would correspond to a multi-level cell (MLC) memory) is possible. The limitation to a binary random variable may not apply on the channel output Y. Therefore, the cell voltage could be read more accurately at the decoder to increase the coding performance, similarly to the soft decoding method that is used in flash memories with codes known as low-density parity-check (LDPC) codes.

An example scheme that may achieve the capacity of Theorem 4 is described below in this Section III, Channels With Non-Causal Encoder State Information, as Construction C, in the subsection C below, "*Multicoding Construction without Degradation*". The capacity achieving result may be summarized in the following theorem, Theorem 5.

Theorem 5. Construction C achieves the capacity of the Gelfand-Pinsker Theorem with Cost Constraint (Theorem 4) with low computational complexity.

An example case of the setting of Theorem 4 is the setting of channel coding with input cost constraint (without state information). Therefore, Theorem 5 may also imply that Construction C may achieve the capacity of the setting of channel coding with an input cost constraint. In this Section III, two special cases of the Gelfand-Pinsker model that are useful for the rewriting of flash memories are described. Afterward, in Section III, two versions of the example construction schemes that correspond to the two special cases of the model will be described.

A. Special Cases

First, an example special case that is quite a natural model for flash memory rewriting will be described below.

Example 1

Let the sets $X, \mathcal{S}$, and $\mathcal{Y}$ be all equal to $\{0,1\}$, and let the state probability mass function (pmf) be $p_S(1) = \beta$. This model may correspond to a single level cell flash memory. When s=0, the cell may behave as a binary asymmetric channel, since the cell state may not interfere with the writing attempt. When s=1, the cell may behave as if a value of 1 was attempted to be written, regardless of the actual value attempted. However, an error might still occur, during the writing process or anytime afterward. Thus, it can be said that when s=1, the cell may behave as a binary asymmetric channel with input "1". Formally, the channel pmf's may be given by:

$$p_{Y|XS}(1 \mid x, s) = \begin{cases} p_0 & \text{if}(x, s) = (0, 0) \\ 1 - p_1 & \text{otherwise} \end{cases} \quad (7)$$

The cost constraint may be given by b $(x_i)=x_i$, since it can be useful to limit the amount of cells written to a value of 1.

The coding scheme described herein may be based on an auxiliary variable V, as in the coding scheme of Gelfand and Pinsker that achieves the capacity of Theorem 4. The Gelfand-Pinsker coding scheme may be computationally inefficient. One aspect of the presently disclosed techniques achieves the same rate, but with efficient computation. Construction of coding schemes for general Gelfand-Pinsker settings may be based on a more limited construction. First, the limited construction will be described. Then, the limited construction can be extended to the more general case. The limitation may be related to the auxiliary variable V that is chosen for the code design. The limitation may be applied on a property called channel degradation, as provided in the following.

Example for Channel Degradation.

See, e.g., Gamal and Kim, *Network Information Theory*, supra, at p. 112. A discrete memory-less channel (DMC) $W_1$: $\{0,1\} \rightarrow \mathcal{Y}_1$ is stochastically degraded (or simply degraded) with respect to a DMC $W_2$: $\{0,1\} \rightarrow \mathcal{Y}_2$, denoted as $W_1 \circ W_2$, if there exists a DMC W: $\mathcal{Y}_2 \rightarrow \mathcal{Y}_1$ such that W satisfies the equation $W_1(y_1|x) = \Sigma_{y_2 \in \mathcal{Y}_2} W_2(y_2|x)W(y_1|y_2)$.

The first coding scheme described herein may achieve the capacity of channels for which the following property holds.

Property for Capacity Maximization.

The functions p(v|s) and x(v, s) that maximizes the Gelfand-Pinsker capacity in Theorem 4 satisfy the condition p(y|v)±p(s|v).

It is not known whether the model of Example 1 satisfies the degradation condition of the Property for Capacity Maximization. However, the model can be modified such that it will satisfy the Property for Capacity Maximization, while sacrificing some of the "accuracy" of the model.

Example 2

Let the sets X, $\mathcal{S}$ and $\mathcal{Y}$ be all equal to $\{0,1\}$. The channel and state pmfs may be given by $p_S(1) = \beta$ and:

$$p_{Y|XS}(1 \mid x, s) = \begin{cases} \alpha & \text{if}(x, s) = (0, 0) \\ 1-\alpha & \text{if}(x, s) = (1, 0) \\ 1 & \text{if } s = 1 \end{cases} \quad (8)$$

For instance, if s=1 then the channel output may be 1, and if s=0, the channel may behave as a binary symmetric channel. This may correspond to the limitation on changing the cell level from logic "0" to logic "1". The stochastic noise model beyond this limitation may not be entirely natural, and may be chosen to satisfy the degradation condition. The cost constraint may be given by $b(x_i)=x_i$.

The model of Example 2 above may satisfy the degradation condition of the Property for Capacity Maximization. To show this, the functions p(v|s) and x(v, s) that maximize or otherwise increase the Gelfand-Pinsker capacity in Theorem 4 can be determined to satisfy this degradation condition. Those functions can be established in the following theorem.

Theorem 6. The capacity of the channel in Example 2 is:

$\mathcal{C} = (1-\beta)[h(\varepsilon^*\alpha) - h(\alpha)]$, where $\varepsilon = \beta/(1-\beta)$ and $\varepsilon^*\alpha \equiv \varepsilon(1-\alpha) + (1-\varepsilon)\alpha$. The selections $v = \{0,1\}$, $x(v, s) = v \vee s$ (where $\vee$ is the logical OR operation), and:

$$p_{V|S}(1 \mid 0) = \varepsilon, \ p_{V|S}(1 \mid 1) = \frac{\varepsilon(1-\alpha)}{\varepsilon * \alpha} \quad (9)$$

achieves this capacity.

Theorem 6 may be similar to C. Heegard, "On The Capacity Of Permanent Memory," *IEEE Trans. Information Theory*, Vol. 31, No. 1, pp. 34-42, January 1985; Theorem 4. The proof of Theorem 6 is described in Appendix A below. The upper bound may be obtained by assuming that the state information is available also at the decoder, and the lower bound may be obtained by setting the functions x(v, s) and p(v|s) according to the statement of the theorem. The proof that the model in Example 2 satisfies the degradation condition of the Property for Capacity Maximization may be completed by the following lemma, which is related to Theorem 6.

Lemma 6a. The capacity achieving functions of Theorem 6 for the model of Example 2 satisfy the degradation condition of the Property for Capacity Maximization. That is, the channel p(s|v) is degraded with respect to the channel p(y|v).

Lemma 6a is proved in Appendix B below, and consequently, the capacity of the model in Example 2 can be achieved by the example coding scheme disclosed herein. In the next subsection a simpler coding scheme is described that may achieve the capacity of Example 2, and of any model that satisfies the Property for Capacity Maximization.

B. Multicoding Construction for Degraded Channels

The setting of asymmetric channel coding, which was discussed in Section 2, may satisfy the Property for Capacity Maximization. In the asymmetric channel coding case, the state can be thought of as a deterministic variable, and therefore W can be selected per the Definition for Channel Degradation (above) to be deterministic as well, and by that, to satisfy the Property for Capacity Maximization. This implies that the construction presented in this section may be a generalization of Construction A for an asymmetric channel.

The construction may have a similar structure to the Gelfand-Pinsker scheme. The encoder may first find a vector $v_{[n]}$ in a similar manner to that described in Construction A, where the random variable X|Y is replaced with V|Y, and the random variable X is replaced with V|S. The random variable V may be taken according to the pmf's p(v|s) that maximize the rate expression in Equation (6). Then each bit $i \in [n]$ in the codeword $x_{[n]}$ may be calculated by the function $x_i(v_i, s_i)$ that maximizes Equation (6). Using the model of Example 2, the functions p(v|s) and x(v, s) may be used according to Theorem 6. Similarly, considering Equation (2), the replacements imply that the asymptotic rate of the codes would be $|\mathcal{H}_{V|S} \cap \mathcal{L}_{V|Y}|/n \rightarrow H(V|S) - H(V|Y) = I(V; Y) - I(V; S)$, which achieves the Gelfand-Pinsker capacity of Theorem 4 (the connection of Theorem 2 to the Bhattacharyya parameters may be achieved through consideration of Proposition 1). The coding scheme can be formally described as follows.

Construction B.

This section describes a construction that provides example operations for encoding and decoding schemes to produce codewords as output of encoding a message and to produce an estimated message as output of decoding an input codeword.

Example Message Encoding Scheme

Input: a message $m_{[|\mathcal{H}_{V|S} \cap \mathcal{L}_{V|Y}|]} \in \{0,1\}^{|\mathcal{H}_{V|S} \cap \mathcal{L}_{V|Y}|}$ and a state $s_{[n]} \in \{0,1\}^n$.

Output: a codeword $x_{[n]} \in \{0,1\}^n$.

1. For each i for 1 to n, assign a variable u as follows:

$$u_i = \begin{cases} u \in \{0,1\} \text{ with probability} \\ p_{U_i|U_{[i-1]},S_{[n]}}(u \mid u_{[i-1]}, s_{[n]}) & \text{if } i \in \mathcal{H}_{V|S}^c \\ m_{r(i;\mathcal{H}_{V|S} \cap \mathcal{L}_{V|Y})} & \text{if } i \in \mathcal{H}_{V|S} \cap \mathcal{L}_{V|Y} \\ f_{r(i;\mathcal{H}_{V|S} \cap \mathcal{L}_{V|Y}^c)} & \text{if } i \in \mathcal{H}_{V|S} \cap \mathcal{L}_{V|Y}^c \end{cases} \quad (10)$$

2. Calculate $v_{[n]} = u_{[n]} G_n$ and for each $i \in [n]$, store the value $x_i(v_i, s_i)$.

3. Store the vector $u_{\mathcal{L}_{V|Y}^c \cap \mathcal{H}_V^c}$ separately using a linear, non-capacity-achieving polar code with a uniform input distribution.

Example Input Decoding Scheme

Input: a noisy vector $y_{[n]} \in \{0,1\}^n$.

Output: a message estimation $\hat{m}_{[|\mathcal{H}_{V|S} \cap \mathcal{L}_{V|Y}|]} \in \{0,1\}^{|\mathcal{H}_{V|S} \cap \mathcal{L}_{V|Y}|}$ 1. Estimate the vector $u_{\mathcal{L}_{V|Y}^c \cap \mathcal{H}_{V|S}^c}$ by $\hat{u}_{\mathcal{L}_{V|Y}^c \cap \mathcal{H}_{V|S}^c}$ 2. Estimate $u_{[n]}$ by $\hat{u}_{[n]}(y_{[n]}, f_{[|\mathcal{L}_{V|Y}^c \cap \mathcal{H}_{V|S}|]})$ as follows: For each i from 1 to n, assign:

$$\hat{u}_i = \begin{cases} \operatorname{argmax}_{u \in \{0,1\}} p_{U_i|U_{[i-1]},Y_{[n]}}(u \mid u_{[i-1]}, y_{[n]}) & \text{if } i \in \mathcal{L}_{V|Y} \\ \hat{u}_{r(i,\mathcal{L}_{V|Y}^c \cap \mathcal{H}_{V|S}^c)} & \text{if } i \in \mathcal{L}_{V|Y}^c \cap \mathcal{H}_{V|S}^c \\ f_{r(i,\mathcal{L}_{V|Y}^c \cap \mathcal{H}_{V|S})} & \text{if } i \in \mathcal{L}_{V|Y}^c \cap \mathcal{H}_{V|S} \end{cases} \quad (11)$$

3. Return the estimated message $\hat{m}_{[|\mathcal{H}_{V|S} \cap \mathcal{L}_{V|Y}|]} = \hat{u}_{\mathcal{H}_{V|S} \cap \mathcal{L}_{V|Y}}$ The asymptotic performance of Construction B may be stated in the following theorem.

Theorem 7. If the Property for Capacity Maximization holds, then Construction B achieves the capacity of Theorem 4 with low computational complexity.

The proof of Theorem 7 is provided in Appendix C. The next subsection describes a method to remove the degradation requirement of the Property for Capacity Maximization. This would also allow achievement of the capacity of the more realistic model of Example 1.

C. Multicoding Construction without Degradation

A chaining idea was proposed in Mondelli and Hassani, "Achieving Marton's Region For Broadcast Channels Using Polar Codes," supra, that achieves the capacity of models that do not exhibit the degradation condition of the Property for Capacity Maximization. In Modelli et al., the chaining idea was presented in the context of broadcast communication and point-to-point universal coding. Chaining can be connected here to the application of flash memory rewriting through Example 1. Note also that the chaining technique that follows may come with a price of a slower convergence to the channel capacity, and thus a lower non-asymptotic code rate might be realized.

The feature of Construction B for degraded channels may result from the set $\mathcal{H}_{V|S}^c \cap \mathcal{L}_{V|Y}^c$, which is to be communicated to the decoder in a side channel. If the fraction $(1/n)|\mathcal{H}_{V|S}^c \cap \mathcal{L}_{V|Y}^c|$ vanishes with n, Construction B may achieve the channel capacity. In the case that the fraction $(1/n)|\mathcal{H}_{V|S}^c \cap \mathcal{L}_{V|Y}^c|$ does not vanish, then similar to Equation (2), the set follows:

$$|H_{V|S}^c \cap L_{V|Y}^c|/n = 1 - |H_{V|S}^c \cup L_{V|Y}^c|/n$$
$$= 1 - |H_{V|S}^c|/n - |L_{V|Y}^c|/n + |H_{V|S}^c \cap L_{V|Y}^c|/n \to$$
$$I(V;Y) - I(V;S) + |H_{V|S}^c \cap L_{V|Y}^c|/n.$$

The subvector $u_{\mathcal{H}_{V|S}^c \cap \mathcal{L}_{V|Y}^c}$ can be stored in a subset of the indices $\mathcal{H}_{V|S}^c \cap \mathcal{L}_{V|Y}^c$ of an additional code block of n cells. The additional block can use the same coding technique as the original block. Therefore, the additional block can use approximately I(V; Y)–I(V; S) of the cells to store additional message bits, and the channel capacity can be approached. However, the additional block may observe the same difficulty as the original block with the set $H_{V|S}^c \cap L_{V|Y}^c$. To solve this, the same solution can be recursively applied, sending in total k blocks, each of the k blocks being of length n. Each block can store a source message (or fraction thereof) that may approach the channel capacity. The "problematic" bits of a block k can be stored using yet another block, but this additional block can be coded without taking the state information into account, and thus may not face the same difficulty. The last block may thus cause a rate loss, but this loss may be of a fraction 1/k, which may vanish for large values of k. In the following description, an example construction can denote the index i of the j-th block of the message by $m_{i,j}$, and similarly for other vectors. The vectors themselves may also be denoted in two dimensions, for example $x_{[n],[k]}$.

Construction C.

This section describes a construction that provides example operations for encoding and decoding schemes to produce codewords as output of encoding a message and to produce an estimated message as output of decoding an input codeword.

Let $\mathcal{R}$ be an arbitrary subset of $\mathcal{H}_{V|S}^c \cap \mathcal{L}_{V|Y}^c$ of size $|\mathcal{H}_{V|S}^c \cap \mathcal{L}_{V|Y}^c|$.

Example Message Encoding Scheme

Input: a message $m_{[(|\mathcal{H}_{V|S} \cap \mathcal{L}_{V|Y}| - |\mathcal{H}_{V|S}^c \cap \mathcal{L}_{V|Y}^c|],[k])} \in \{0,1\}^{k(|\mathcal{H}_{V|S} \cap \mathcal{L}_{V|Y}| - |\mathcal{H}_{V|S}^c \cap \mathcal{L}_{V|Y}^c|)}$ and a state $S_{[n],[k]} \in \{0,1\}^{kn}$.

Output: a codeword $x_{[n],[k]} \in \{0,1\}^{kn}$.

1) Let $u_{[n],0} \in \{0,1\}^n$ be an arbitrary vector. For each j from 1 to k, and for each i from 1 to n, assign:

$$u_{i,j} = \begin{cases} u \in \{0,1\} \text{ with probability} \\ p_{U_i|U_{[i-1]},S_{[n]}}(u \mid u_{[i-1]}, s_{[n]}) & \text{if } i \in \mathcal{H}_{V|S}^c \\ m_{r(i;\mathcal{H}_{V|S} \cap \mathcal{L}_{V|Y}),j} & \text{if } i \in (\mathcal{H}_{V|S} \cap \mathcal{L}_{V|Y}) \setminus \mathcal{R} \\ u_{r(i;\mathcal{H}_{V|S}^c \cap \mathcal{L}_{V|Y}^c),j-1} & \text{if } i \in \mathcal{R} \\ f_{r(i;\mathcal{H}_{V|S} \cap \mathcal{L}_{V|Y}^c),j} & \text{if } i \in \mathcal{H}_{V|S} \cap \mathcal{L}_{V|Y}^c \end{cases} \quad (12)$$

2) For each j from 1 to k, calculate $v_{[n],j} = u_{[n],j} G_n$, and for each $i \in [n]$, store the value $x_{i,j}(v_{i,j}, s_{i,j})$.

3) Store the vector $u_{\mathcal{H}_V^c \cap \mathcal{L}_{V|Y}^c,k}$ separately using a non-capacity-achieving polar code with a uniform input distribution.

Example Input Decoding Scheme

Input: a noisy vector $y_{[n],[k]} \in \{0,1\}^k n$.

Output: a message estimation $\hat{m}_{[|\mathcal{H}_{V|S} \cap \mathcal{L}_{V|Y}| - |\mathcal{H}^c_{V|S} \cap \mathcal{L}^c_{V|Y}|],[k]} \in \{0,1\}^{k|\mathcal{H}_{V|S} \cap \mathcal{L}_{V|Y}| - |\mathcal{H}^c_{V|S} \cap \mathcal{L}^c_{V|Y}|}$ 1) Estimate the vector $u_{\mathcal{L}^c_{V|Y} \cap \mathcal{H}^c_{V|S},k}$ by $\hat{u}_{\mathcal{L}^c_{V|Y} \cap \mathcal{H}^c_{V|S},k}$ and let $\hat{u}_{\mathcal{R},k+1} = \hat{u}_{\mathcal{L}^c_{V|Y} \cap \mathcal{H}^c_{V|S},k}$ 2) Estimate $u_{[n],[k]}$ by $\hat{u}_{[n],[k]}(y_{[n],[k]}, f_{[|\mathcal{L}^c_{V|Y} \cap \mathcal{H}_{V|S}|],[k]})$ as follows: For each j down from k to 1, and for each i from 1 to n, assign:

$$\hat{u}^j_i = \begin{cases} \text{argmax}_{u \in \{0,1\}} p_{U_i | U_{[i-1]}, Y_{[n]}}(u | u_{[i-1],j}, y_{[n],j}) & \text{if } i \in \mathcal{L}_{V|Y} \\ \hat{u}_{r(i,\mathcal{R}),j+1} & \text{if } i \in \mathcal{L}^c_{V|Y} \cap \mathcal{H}^c_{V|S} \\ f_{r(i,\mathcal{L}^c_{V|Y} \cap \mathcal{H}_{V|S}),j} & \text{if } i \in \mathcal{L}^c_{V|Y} \cap \mathcal{H}_{V|S} \end{cases} \quad (13)$$

3) Return the estimated message $\hat{m}_{[|\mathcal{H}_{V|S} \cap \mathcal{L}_{V|Y}| - |\mathcal{H}^c_{V|S} \cap \mathcal{L}^c_{V|Y}|],[k]} = \hat{u}_{(\mathcal{H}_{V|S} \cap \mathcal{L}_{V|Y}) \setminus \mathcal{R},[k]}$ Constructions B and C can also be used for communication over broadcast channels in Marton's region, see for example Goela and Gastpar, "Polar Codes For Broadcast Channels", supra; and Mondelli et al., "Achieving Marton's Region For Broadcast Channels Using Polar Codes", supra. Constructions B and C may improve on these previous results since they provably achieve the capacity with linear storage requirement.

Construction C may achieve the capacity of Theorem 4 with low complexity, without the degradation requirement of the Property for Capacity Maximization. This result was stated in Theorem 5. The proof of Theorem 5 follows directly from Theorem 7 and the fact that the rate loss may vanish with large values of k. Construction C may be useful for the realistic model of flash memory-rewriting of Example 1, using the appropriate capacity-achieving functions p(v|s) and x(v, s).

IV. Example Embodiments

Figure 2:
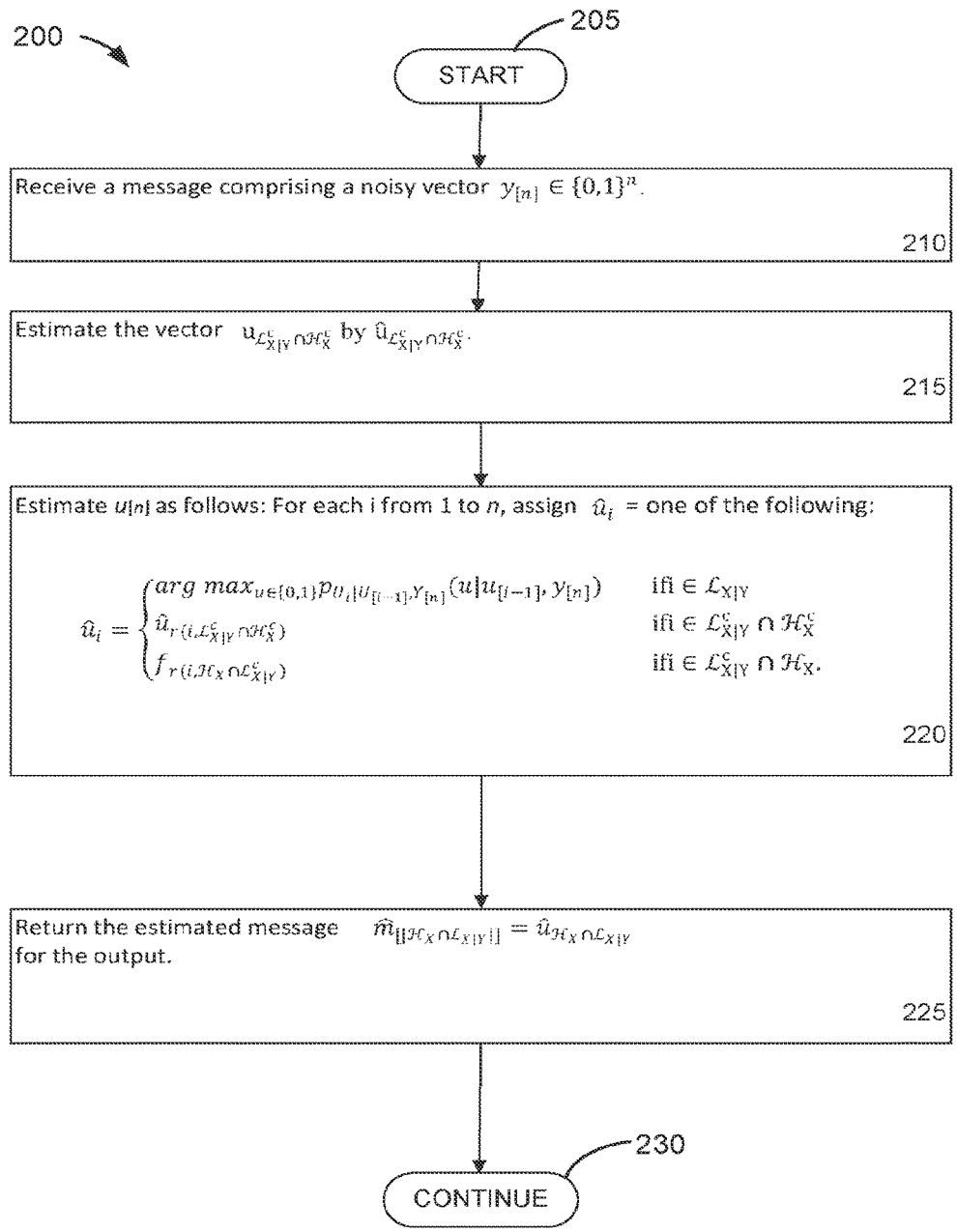
FIG. 2 is a flow diagram that illustrates operations that may be performed in a memory device constructed according to various examples for decoding a data message as disclosed herein.
Figure 3:
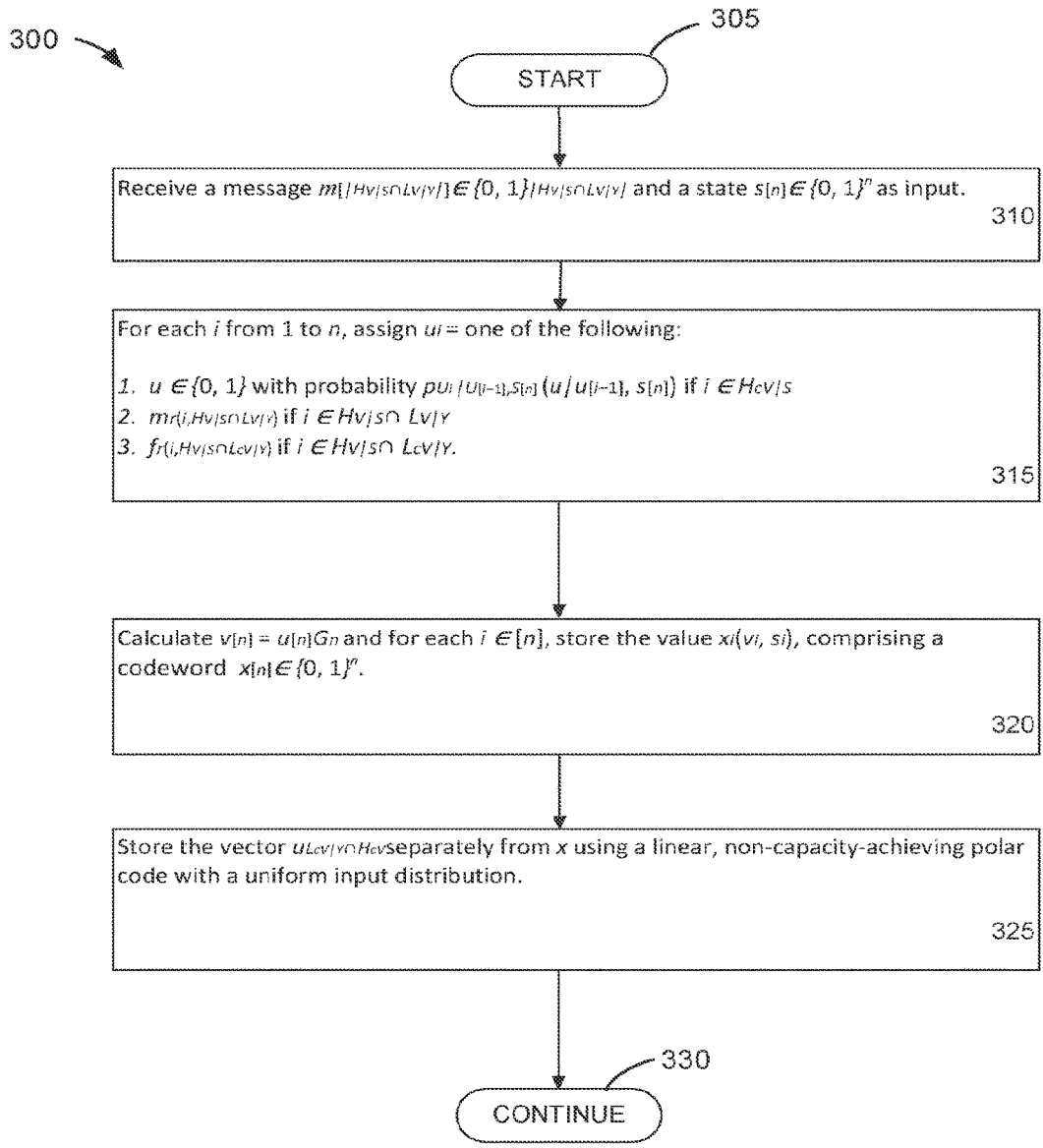
FIG. 3 is a flow diagram that illustrates operations that may be performed in a memory device constructed according to various examples for encoding a data message as disclosed herein.
Figure 4:
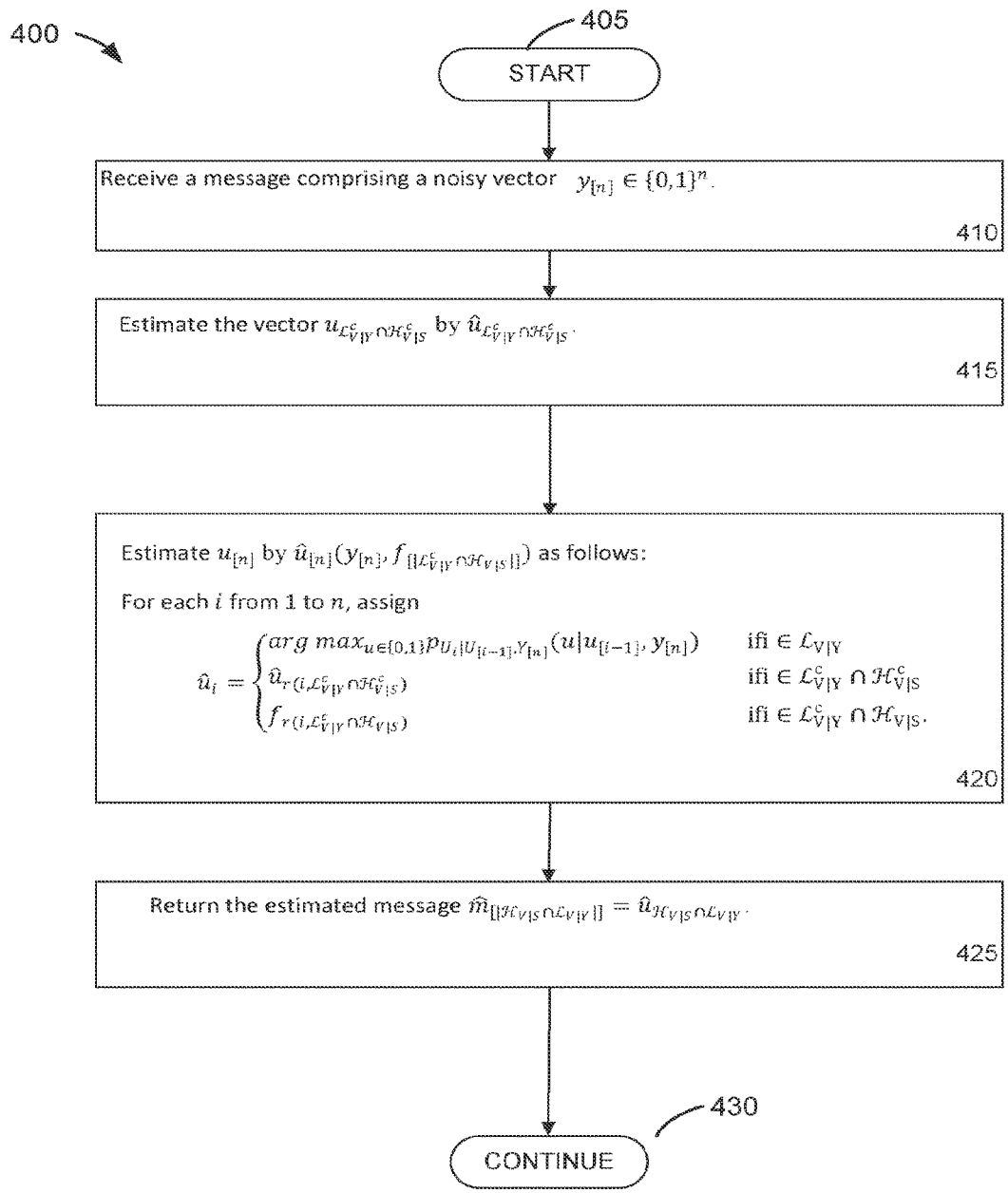
FIG. 4 is a flow diagram that illustrates operations that may be performed in a memory device constructed according to various examples for decoding a data message as disclosed herein.
Figure 5:
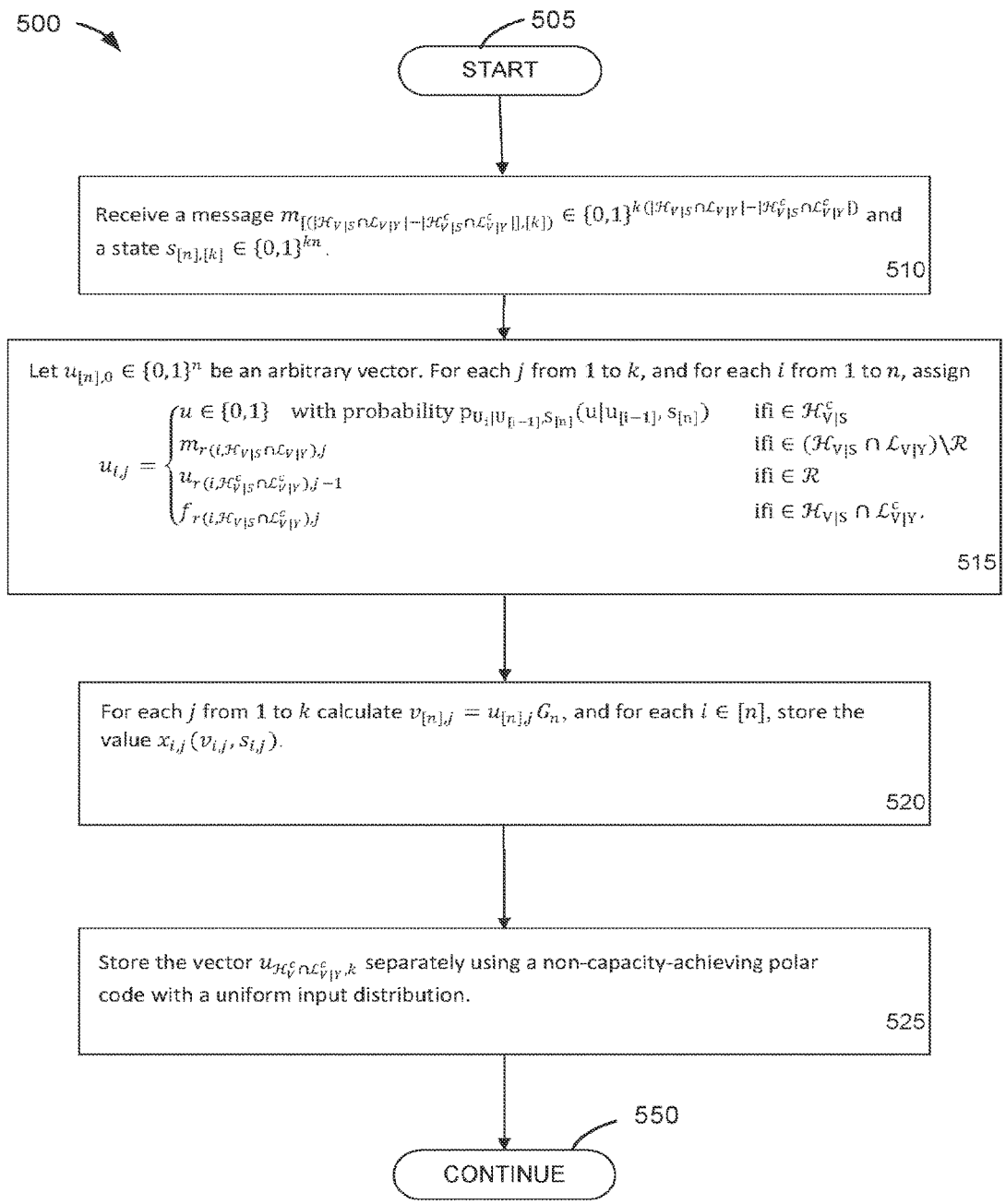
FIG. 5 is a flow diagram that illustrates operations that may be performed in a memory device constructed according to various examples for encoding a data message as disclosed herein.
Figure 6:
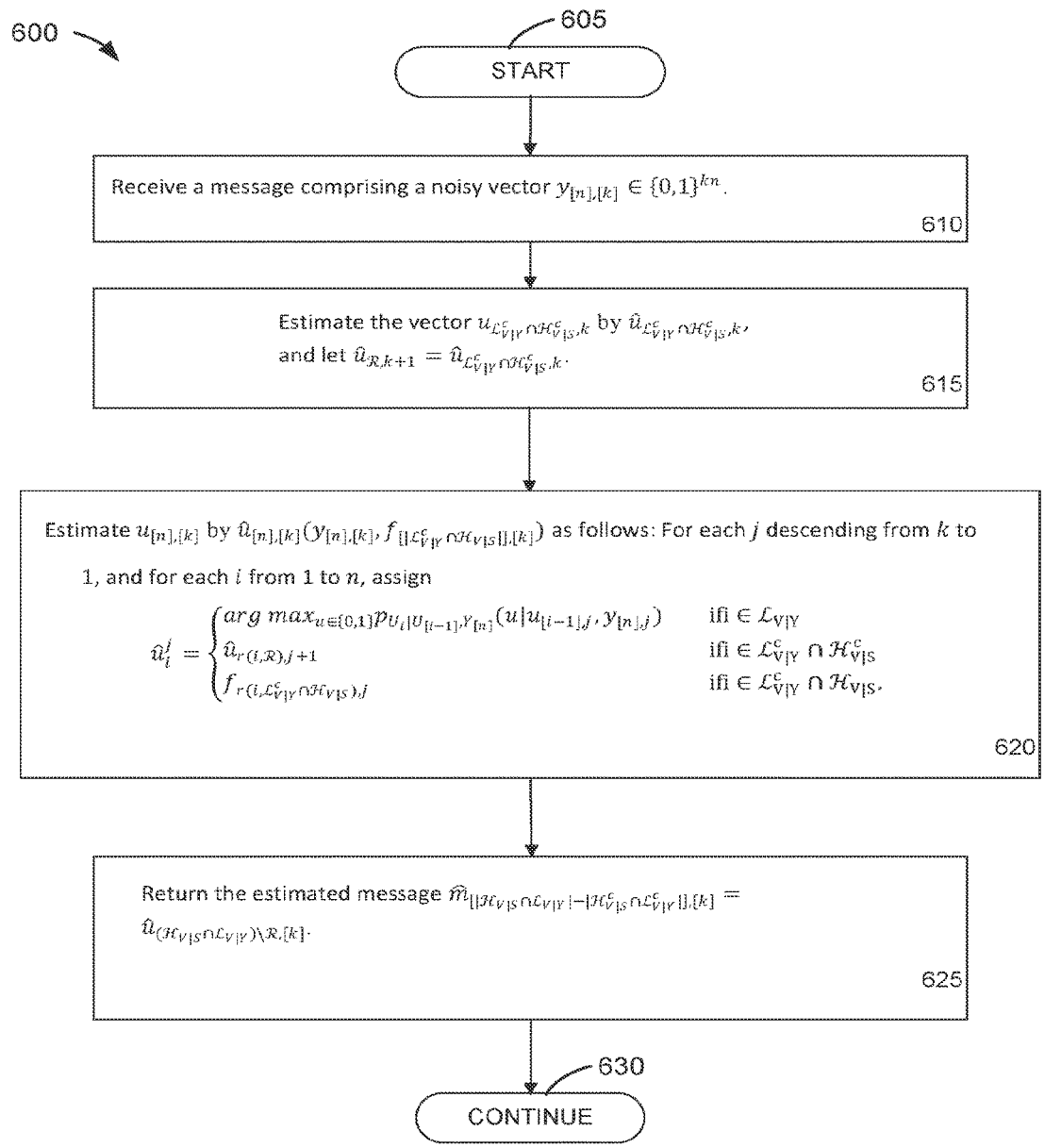
FIG. 6 is a flow diagram that illustrates operations that may be performed in a memory device constructed according to various examples for decoding a data message as disclosed herein.

The following descriptions are for the accompanying drawing illustrations, in which FIG. 1 is a flow diagram that illustrates operations that may be performed in a memory device constructed according to various examples for decoding a data message as disclosed herein, and more particularly, shows example data encoding operations to encode a data value into a codeword according to Construction A. In additional drawings, FIG. 2 is a flow diagram that illustrates operations that may be performed in a memory device constructed according to various examples for decoding a data message as disclosed herein, and more particularly, represents example decoding operations to recover a data value from a codeword according to Construction A. FIG. 3 is a flow diagram that illustrates operations that may be performed in a memory/data device constructed according to various examples for encoding a data message as disclosed herein, and more particularly, represents example data encoding operations to encode a data value into a codeword according to Example 1. FIG. 4 is a flow diagram that illustrates operations that may be performed in a memory device constructed according to various examples for decoding a data message as disclosed herein, and more particularly, represents example decoding operations to recover a data value from a codeword according to Example 1. FIG. 5 is a flow diagram that illustrates operations that may be performed in a memory device constructed according to various examples for encoding a data message as disclosed herein, and more particularly, represents example data encoding operations to encode a data value into a codeword according to Example 2. FIG. 6 is a flow diagram that illustrates operations that may be performed in a memory device constructed according to various examples for decoding a data message as disclosed herein, and more particularly, represents example decoding operations to recover a data value from a codeword according to Example 2. The operations of FIGS. 1, 2, 3, 4, 5, 6 may performed, for example, by the device embodiments illustrated in FIGS. 7, 8, 9, as described further below.

FIG. 1 shows an example method 100 of operating a data device constructed in accordance with the presently disclosed technology for a processor to generate a codeword from a message received over a communications channel. As noted above, the FIG. 1 operations may correspond to the technique described above in connection with Construction A, for the example encoding scheme. The method 100 may include one or more operations, actions, or functions as illustrated by one or more of the blocks 105, 110, 115, 120, 125, and 130. Although illustrated as discrete blocks in FIG. 1, the various blocks may be divided into additional blocks, combined into fewer blocks, supplemented with further blocks, modified, or eliminated, depending on the particular implementation.

At the block 105, the process can be started. The block 105 can be followed by the next block 110, "Receive a message", where an input message m may be received. In some examples, the received message m is to be encoded and stored in data storage, where the message m may comprise a sequence of bits received over a message channel, and may be designated as $m_{[|\mathcal{H}_X \cap \mathcal{L}_{X|Y}|]} \in \{0,1\}^{|\mathcal{H}_X \cap \mathcal{L}_{X|Y}|}$. The FIG. 1 block 110 can be followed by the block 115, an operation to generate a codeword. In some examples, a codeword u can be generated, bit by bit, according to the operations illustrated in the block 115:

For i from 1 to n, successively, set $$u_i = \begin{cases} u \in \{0, 1\} \text{ with probability} & \\ p_{U_i|U_{[i-1]}}(u | u_{[i-1]}) & \text{if } i \in \mathcal{H}^c_X \\ m_{r(i, \mathcal{H}_X \cap \mathcal{L}_{X|Y})} & \text{if } i \in \mathcal{H}_X \cap \mathcal{L}_{X|Y} \\ f_{r(i, \mathcal{H}_X \cap \mathcal{L}^c_{X|Y})} & \text{if } i \in \mathcal{H}_X \cap \mathcal{L}^c_{X|Y} \end{cases}$$

The block 115 can be followed by the block 120, where a value v may be calculated such that the codeword $x_{[n]} = u_{[n]} G_n$ is transmitted.

The block 120 can be followed by the block 125, in which the vector u formed by the preceding operations can be stored. In some examples, the operation of block 125 may comprise:

The vector $u_{\mathcal{L}_{X|Y}^c \cap \mathcal{H}_X^c}$ is transmitted separately using a linear, non-capacity-achieving polar code with a uniform input distribution.

In light of the present disclosure, those skilled in the art will understand how to store the vector u using the noted polar code with a uniform input distribution. The operation of the memory device can be continued from the block 125 with additional operations at the block 130.

The operations of FIG. 1 illustrate receipt of a message comprising a value to be encoded. A codeword as discussed above may be generated that satisfies the constrained operation disclosed, in which the codewords are configured for representation by multiple cells such that, once a cell value is changed from logic "0" to logic "1", the value of that cell may remain at logic "1", even if the corresponding stored data value is changed.

FIG. 2 shows an example method 200 of operating a data device constructed in accordance with the presently disclosed technology for a processor to produce an estimated message (e.g., a recovered message) by decoding a message (e.g., a noisy vector) received over a communications channel. That is, FIG. 2 shows example operations of a data device in which the data device receives a message comprising binary digits that correspond to an encoded data value. The received message can be estimated as an original source data value that was encoded, along with a noise term that represents error in the communications channel. As noted above, the FIG. 2 operations may correspond to the technique described above in connection with Construction A, for the example decoding scheme. The method 200 may include one or more operations, actions, or functions as illustrated by one or more of the blocks 205, 210, 215, 220, 225, and 230. Although illustrated as discrete blocks in FIG. 2, various blocks may be divided into additional blocks, combined into fewer blocks, supplemented with further blocks, modified, or eliminated, depending on the particular implementation.

At the block 205, the process can be started. The block 205 can be followed by the next block 210, "Receive a message . . . ," where an input message is received, that may comprise a vector y that is to be decoded to recover a data value. The vector y may be represented to include a noise term from the data channel over which the data message is received, where vector y can be represented as $y_{[n]} \in \{0,1\}^n$. The block 210 can be followed by the block 215, "Estimate the vector u . . . ", where an estimated value u representing the original data value can be generated in a bitwise manner. In some examples, the vector u estimation may be given by estimating the vector $u_{\mathcal{L}_{X|Y}^c \cap \mathcal{H}_X^c}$ by $\hat{u}_{\mathcal{L}_{X|Y}^c \cap \mathcal{H}_X^c}$ The block 215 can be followed by the block 220, "Estimate the vector u . . . ". In some examples, the estimate u may be calculated bit by bit, according to:

Estimate the vector u by: For i from 1 to n, set:

$$\hat{u}_i = \begin{cases} \text{argmax}_{u \in \{0,1\}} p_{U_i|U_{[i-1]},Y_{[n]}}(u \mid u_{[i-1]}, y_{[n]}) & \text{if } i \in \mathcal{L}_{X|Y} \\ \hat{u}_{r(i,\mathcal{L}_{X|Y}^c \cap \mathcal{H}_X^c)} & \text{if } i \in \mathcal{L}_{X|Y}^c \cap \mathcal{H}_X^c \\ f_{r(i,\mathcal{H}_X \cap \mathcal{L}_{X|Y}^c)} & \text{if } i \in \mathcal{L}_{X|Y}^c \cap \mathcal{H}_X \end{cases}$$

The block 220 can be followed by the block 225, "Return the estimated message m̂" where an estimated message value m̂ (the estimated original source data value) may be determined and returned. In some examples, the estimated message may be determined as:

Return the estimated message $\hat{m}_{[|\mathcal{H}_X \cap \mathcal{L}_{X|Y}|]} = \hat{u}_{\mathcal{H}_X \cap \mathcal{L}_{X|Y}}$ The operation of the memory device can be continued with additional operations at the block 230.

The data operations of FIG. 2 may receive a message comprising one or more values to be decoded, such that the message is received that may comprise a codeword as discussed above, wherein the codeword was generated in a process suitable for an asymmetric channel with a memory cell input x and a memory cell output of y, wherein the number of memory cells may be n. For Construction A, which can be achieved through the FIG. 2 operations, the previous state of the memory cell may not be considered. Thus, the codewords may be configured for representation by multiple cells such that, once a cell value is changed from logic "0" to logic "1", the value of that cell can be rewritten to either logic "0" or logic "1", so that the received codeword may be decoded and an estimate m of the original stored value may be recovered.

FIG. 3 illustrates an example method 300 of operating a data device constructed in accordance with the presently disclosed technology for a processor to generate a codeword from a message received over a communications channel. The method 300 may include one or more operations, actions, or functions as illustrated by one or more of the blocks 305, 310, 315, 320, 325, and 330. Although illustrated as discrete blocks in FIG. 3, various blocks may be divided into additional blocks, combined into fewer blocks, supplemented with further blocks, modified, or eliminated, depending on the particular implementation.

At the block 305, the process can be started. The block 305 can be followed by the next block 310, "Receive a message m . . . and a state s . . . ", where an input message and a state may be received. In some examples, the message m is to be encoded and stored in a data storage, where the message m may be designated as $m_{[|\mathcal{H}_{V|S} \cap \mathcal{L}_{V|Y}|]} \in \{0,1\}^{|\mathcal{H}_{V|S} \cap \mathcal{L}_{V|Y}|}$ and where the state s may be designated $s_{[n]} \in \{0,1\}^n$. The block 310 can be followed by the block 315, in which a codeword can be generated. In some examples, a codeword u can be generated, bit by bit, according to the operations illustrated in the block 315:

For each i from 1 to n, assign:

$$u_i = \begin{cases} u \in \{0,1\} \text{ with probability} \\ \quad p_{U_i|U_{[i-1]},S_{[n]}}(u \mid u_{[i-1]}, s_{[n]}) & \text{if } i \in \mathcal{H}_{V|S}^c \\ m_{r(i,\mathcal{H}_{V|S} \cap \mathcal{L}_{V|Y})} & \text{if } i \in \mathcal{H}_{V|S} \cap \mathcal{L}_{V|Y} \\ f_{r(i,\mathcal{H}_{V|S} \cap \mathcal{L}_{V|Y}^c)} & \text{if } i \in \mathcal{H}_{V|S} \cap \mathcal{L}_{V|Y}^c \end{cases}$$

The block 315 can be followed by the block 320, where a value v can be calculated according to the following:

Calculate $v_{[n]} = u_{[n]} G_n$ and for each $i \in [n]$, store the value $x_i(v_i, s_i)$, comprising a codeword $x_{[n]} \in \{0,1\}^n$.

The block 320 can be followed by the block 325, in which the vector u formed by the preceding operations can be stored. In some examples, the operation of block 325 may comprise:

Store the vector $u_{\mathcal{L}_{V|Y}^c \cap \mathcal{H}_V^c}$ separately using a linear, non-capacity-achieving polar code with a uniform input distribution.

In light of the present disclosure, those skilled in the art will understand how to store the vector using the noted polar code with a uniform input distribution. The operation of the memory device can be continued from the block 325 with additional operations at the block 330.

The operations of FIG. 3 illustrate receipt of a message comprising a value to be encoded. A codeword as discussed above may be generated that satisfies the constrained operation disclosed, in which the codewords are configured for representation by multiple cells such that, once a cell value is changed from logic "0" to logic "1", the value of that cell may remain at logic "1", even if the corresponding stored data value is changed.

FIG. 4 illustrates an example method 400 of operating a data device constructed in accordance with the presently disclosed technology for a processor to produce an estimated message (e.g., a recovered message) by decoding a message (e.g., a noisy vector) received over a communications channel. For instance, FIG. 4 shows example operations of a data device in which the data device may receive a message comprising binary digits that correspond to an encoded data value, along with noise that represents error in the communications channel. As noted above, the FIG. 4 operations may correspond to the decoding technique described above in connection with Example 1. The method 400 may include one or more operations, actions, or functions as illustrated by one or more of the blocks 405, 410, 415, 420, 425, and 430. Although illustrated as discrete blocks in FIG. 4, various blocks may be divided into additional blocks, combined into fewer blocks, supplemented with further blocks, modified, or eliminated, depending on the particular implementation.

At the block 405, the process can be started. The block 405 can be followed by the next block 410, "Receive a message . . . ," where an input message may be received that comprises a vector y that is to be decoded to recover a data value. Vector y may include noise from the communications channel over which the data message is received, where vector y can be represented as $y_{[n]} \in \{0,1\}^n$. The block 410 can be followed by the block 415, "Estimate a vector u . . . ", where an estimated value u representing the original data value can be generated in a bitwise manner. In some examples, the vector u estimation may be given by estimating the vector $u_{\mathcal{L}_{V|Y}^c \cap \mathcal{H}_{V|S}^c}$ by $\hat{u}_{\mathcal{L}_{V|Y}^c \cap \mathcal{H}_{V|S}^c}$ The block 415 can be followed by the block 420, "Estimate vector u . . . ". In some examples, the estimate u may be calculated bit by bit, according to:

Estimate $u_{[n]}$ by $\hat{u}_{[n]}(y_{[n]}, f_{[|\mathcal{L}_{V|Y}^c \cap \mathcal{H}_{V|S}|]})$ as follows: For each i from 1 to n, assign:

$$\hat{u}_i = \begin{cases} \text{argmax}_{u \in [0,1]} p_{U_i|U_{[i-1]},Y_{[n]}}(u \mid u_{[i-1]}, y_{[n]}) & \text{if } i \in \mathcal{L}_{V|Y} \\ \hat{u}_{r(i, \mathcal{L}_{V|Y}^c \cap \mathcal{H}_{V|S})} & \text{if } i \in \mathcal{L}_{V|Y}^c \cap \mathcal{H}_{V|S}^c \\ f_{r(i, \mathcal{L}_{V|Y}^c \cap \mathcal{H}_{V|S})} & \text{if } i \in \mathcal{L}_{V|Y}^c \cap \mathcal{H}_{V|S} \end{cases}$$

The block 420 can be followed by the block 425, "Return the estimated message m," where an estimated message value m (the estimated original source stored value) may be determined and returned. In some examples, the estimated message may be determined as:

the estimated $\hat{m}_{[|\mathcal{H}_{V|S} \cap \mathcal{L}_{V|Y}|]} = \hat{u}_{\mathcal{H}_{V|S} \cap \mathcal{L}_{V|Y}}$ The operation of the memory device can be continued with additional operations at the block 430.

The data operations of FIG. 4 may receive a message comprising one or more values to be decoded, such that the message is received that may comprise a codeword as discussed above, wherein the codeword was generated in a process that may satisfy the constrained operation disclosed, and in which the codewords may be configured for representation by multiple cells such that, once a cell value is changed from logic "0" to logic "1", the value of that cell may remain at logic "1", even if the corresponding stored data value is changed. The received codeword may be decoded and an estimate m of the original stored value may be recovered.

FIG. 5 shows an example method 500 of operating a data device constructed in accordance with the presently disclosed technology for performing operations in a memory device constructed according to various examples for encoding a data message and, more particularly, represents example data encoding operations to encode a data value into a codeword according to Example 2. The method 500 may include one or more operations, actions, or functions as illustrated by one or more of the blocks 505, 510, 515, 520, 525, and 550. Although illustrated as discrete blocks in FIG. 5, various blocks may be divided into additional blocks, combined into fewer blocks, supplemented with further blocks, modified, or eliminated, depending on the particular implementation.

At the block 505, the process can be started. The block 505 can be followed by the next block 510, where an input data message may be received, the message comprising a value m and a state s, and m is a value that is to be encoded and stored in data storage, where a message $m_{[(|\mathcal{H}_{V|S} \cap \mathcal{L}_{V|Y}| - |\mathcal{H}_{V|S}^c \cap \mathcal{L}_{V|Y}^c|], [k])} \in \{0,1\}^{k(|\mathcal{H}_{V|S} \cap \mathcal{L}_{V|Y}| - |\mathcal{H}_{V|S}^c \cap \mathcal{L}_{V|Y}^c|)}$ and a state $s_{[n],[k]} \in \{0,1\}^{kn}$ may be received as input, for R an arbitrary subset $\mathcal{H}_{V|S}^c \cap \mathcal{L}_{V|Y}$ of size $|\mathcal{H}_{V|S}^c \cap \mathcal{L}_{V|Y}^c|$. The block 510 can be followed by the block 515, where a codeword u may be generated, bit by bit, according to the operations illustrated in the block 515:

Let $u_{[n],0} \in \{0,1\}^n$ be an arbitrary vector. For each j from 1 to k, and for each i from 1 to n, assign:

$$u_{i,j} = \begin{cases} u \in \{0,1\} \text{ with probability } p_{U_i|U_{[i-1]},S_{[n]}}(u \mid u_{[i-1]}, s_{[n]}) & \text{if } i \in \mathcal{H}_{V|S}^c \\ m_{r(i, \mathcal{H}_{V|S} \cap \mathcal{L}_{V|Y}), j} & \text{if } i \in (\mathcal{H}_{V|S} \cap \mathcal{L}_{V|Y}) \backslash \mathcal{R} \\ u_{r(i, \mathcal{H}_{V|S}^c \cap \mathcal{L}_{V|Y}^c), j-1} & \text{if } i \in \mathcal{R} \\ f_{r(i, \mathcal{H}_{V|S} \cap \mathcal{L}_{V|Y}), j} & \text{if } i \in \mathcal{H}_{V|S} \cap \mathcal{L}_{V|Y}^c \end{cases}$$

The block 515 can be followed by the block 520, where a value v may be calculated according to:

For each j from 1 to k calculate $v_{[n],j} = u_{[n],j} G_n$, and for each $i \in [n]$,
store the value $x_{i,j}(v_{i,j}, s_{i,j})$, a codeword $x_{[n],[k]} \in \{0,1\}^{kn}$.

The block 520 can be followed by the block 525, in which the vector x formed by the preceding operations can be stored. The operation of block 525 may comprise:

Store the vector $u_{\mathcal{H}_{V|S}^c \cap \mathcal{L}_{V|Y}, k}$ separately using a non-capacity-achieving polar code with a uniform input distribution.

Those skilled in the art having the benefit of the present disclosure will understand how to store the vector using the noted polar code with a uniform input distribution. The operation of the memory device can be continued at the block 550.

Thus, the data operations of FIG. 5 may receive a data message comprising a value to be encoded, and then a codeword as discussed above may be generated that satisfies the constrained operation disclosed, in which the codewords may be configured for representation by multiple cells such that, once a cell value is changed from logic "0" to logic "1", the value of that cell may remain at logic "1", even if the corresponding stored data value is changed.

FIG. 6 shows an example method 600 of operating a data device constructed in accordance with the presently disclosed technology for performing operations in a memory device constructed according to various examples for decoding a data message and, more particularly, represents example data decoding operations to decode a codeword into an estimated recovered data value according to Example 2. For instance, FIG. 6 shows example operations of a data device in which the data device may receive a message comprising binary digits that may correspond to an encoded data value, along with noise that may represent error in the communications channel. The method 600 may include one or more operations, actions, or functions as illustrated by one or more of the blocks 605, 610, 615, 620, 625, and 630. Although illustrated as discrete blocks in FIG. 6, various blocks may be divided into additional blocks, combined into fewer blocks, supplemented with further blocks, modified, or eliminated, depending on the particular implementation.

At the block 605, the process can be started. The block 605 can be followed by the next block 610, where an input data message may be received, the message comprising a vector value y that is to be decoded to recover a data value, where y may include noise from the data channel over which the data message is received, and a noisy vector $y_{[n],[k]} \in \{0, 1\}^k n$, and the operations of FIG. 6 may return an estimated message or data value m comprising the original source stored value. The block 610 can be followed by the block 615, where an estimated value u representing the original data value may be generated, bit by bit, where the vector u estimation may be given by estimating the vector $u_{L_{Y|Y}^c \cap H_{Y|S}^c, k}$ by $\hat{u}_{L_{Y|S}^c, k}$, and by letting $\hat{u}_{R,k+1} = \hat{u}_{L_{Y|Y}^c \cap H_{Y|S}^c, k}$. The block 615 can be followed by the block 620, where the estimate u may be calculated bit by bit, according to one of the three operations illustrated in the block 620:

Estimate $u_{[n],[k]}$ by $\hat{u}_{[n],[k]}(y_{[n],[k]}, f_{[L_{Y|Y}^c \cap H_{Y|S}^c],[k]})$ as follows: For each j down from k to 1, and for each i from 1 to n, assign:

$$\hat{u}_i^j = \begin{cases} \text{argmax}_{u \in [0,1]} p_{U_i|U_{[i-1]}, Y_{[n]}}(u \mid u_{[i-1],j}, y_{[n],j}) & \text{if } i \in \mathcal{L}_{V|Y} \\ \hat{u}_{r(i,R),j+1} & \text{if } i \in \mathcal{L}_{V|Y}^c \cap \mathcal{H}_{V|S}^c \\ f_{r(i, \mathcal{L}_{V|Y}^c \cap \mathcal{H}_{V|S}),j} & \text{if } i \in \mathcal{L}_{V|Y}^c \cap \mathcal{H}_{V|S} \end{cases}$$

The block 620 can be followed by the block 625, where an estimated message value m (the estimated original source stored value) may be returned according to a calculation such that the estimated message $\hat{m}_{[|H_{Y|S} \cap L_{Y|Y}^c| - |H_{Y|S}^c \cap L_{Y|Y}^c|],[k]} = \hat{u}_{(H_{Y|S} \cap L_{Y|Y})\backslash R,[k]}$, which may be returned. The operation of the memory device can be continued with additional operations at the block 630.

Thus, the data operations of FIG. 6 may receive a data message comprising a value to be decoded, such that a codeword as discussed above may be received, wherein the codeword is generated in a process that may satisfy the constrained operation disclosed, in which the codewords may be configured for representation by multiple cells such that, once a cell value is changed from logic "0" to logic "1", the value of that cell may remain at logic "1", even if the corresponding stored data value is changed. The received codeword may be decoded and an estimate m of the original stored value may be recovered.

Figure 7:
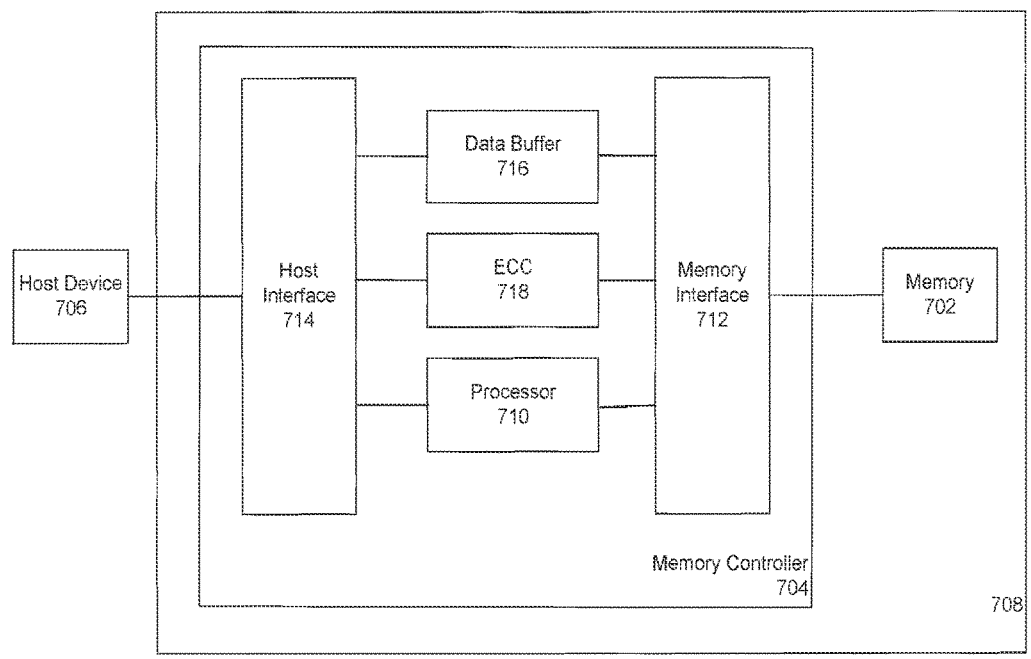
FIG. 7 is an illustration of an example of a memory device constructed in accordance with the presently disclosed technology.

FIG. 7 is an illustration of one embodiment of a memory device constructed in accordance with the presently disclosed technology. A memory device such as a data device 708 of FIG. 7 may include a memory 702 and a memory controller 704, and may be coupled to a host device 706. The memory 702 and the host device 706 may each be coupled to the memory controller 704. The memory controller 704 may include a memory interface 712, a host interface 714, a data buffer 716, an error correction code (ECC) block 718, and a processor 710. The host device 706 can be coupled to the host interface 714 of the memory controller 704. The processor 710 can be implemented as a microcontroller, microprocessor, processor core, custom designed logic, or any other appropriate device that can be configured to cooperate with the memory interface 712 and host interface 714 in accordance with various aspects of the present disclosure.

FIG. 7 shows that the memory 702 can be accessed by the memory controller 704, which is also arranged to communicate with the host device 706. The memory 702 may be used to store data that is represented in accordance with a block erasure-avoiding scheme such as described herein. The memory 702 may be implemented, for example, as a flash memory device having a plurality of memory cells in which the data, comprising one or more binary digits (bits), may be stored.

The memory 702 and memory controller 704 may cooperatively operate as the data device 708 that may be external to the host device 706 or may be integrated with the host device 706 into a single component or system. For example, the data device 708 may comprise a flash memory device (such as a "thumb drive") that communicates with the host device 706 embodied as a host computer, via a USB connection, or the data device 708 may comprise a solid state drive (SSD) device that stores data for a host computer. Alternatively, the data device 708 may be integrated with a suitable host device 706 to comprise a single system or component with memory employing a block erasure-avoiding scheme, such as a smart phone, network router, MP3 player, or other device.

The memory controller 704 may be operable under control of the processor 710, which may be configured to manage communications with the memory 702 via a memory interface 712. The processor 710 may also be configured to manage communications with the host device 706 via the host interface 714. Thus, the memory controller 704 may be configured to manage data transfers between the host device 706 and between the memory 702 and the host device 706. The memory controller 704 also includes the data buffer 716 in which data values may be temporarily stored for transmission between the memory 702 and the host device 706. The memory controller 704 may also include the error correcting code (ECC) block 718 in which data may be maintained. For example, the ECC block 718 may be embodied as a storage device that may comprise data and program code to perform error correction and data encoding/decoding operations for a block erasure-avoiding scheme. The ECC block 718 may contain parameters for the error correction code to be used for the memory 702, such as programmed operations for translating between received symbols and error-corrected symbols, or the ECC block may contain lookup tables for codewords or other data, or the like. As described herein, the symbols, codewords, data, and the like that are transmitted and transferred between the components described herein may comprise multiple binary digits ("bits"). The memory controller 704 may perform the operations described above for decoding data and for encoding data. The data buffer 716, ECC 718, and processor 710 may be interconnected with, and linked to, the host interface 714 and the memory interface 712. The interfaces 712, 714 and all connections between the components described in connection with the embodiments may comprise, for example, multiple physical circuit connections, such as multiple electrically-conducting connections. The connections between components may also or alternatively comprise, for example, optical connections, radio frequency connections, and other techniques for communicating, transmitting, and transferring bits between components.

The operations described above for operating a data device, for reading data from a device, for programming a data device, and encoding and decoding, can be carried out by the operations depicted in FIGS. 1-6, and/or by other operations, which can be performed by the processor 710 and associated components of the data device 708. For example, in an implementation of the block erasure-avoiding scheme in a USB thumb drive, all the components of the data device 708 depicted in FIG. 7 may be contained within the USB thumb drive.

The processing components such as the memory controller 704 and the processor 710 may be implemented according to various embodiments in the form of control logic in software or hardware or a combination of both, and may comprise processors that execute software program instructions from program memory, or as firmware, or the like. The host device 706 may comprise a computer apparatus. A computer apparatus also may carry out the operations of FIGS. 1-6 and/or other operations in some embodiments.

Figure 8:
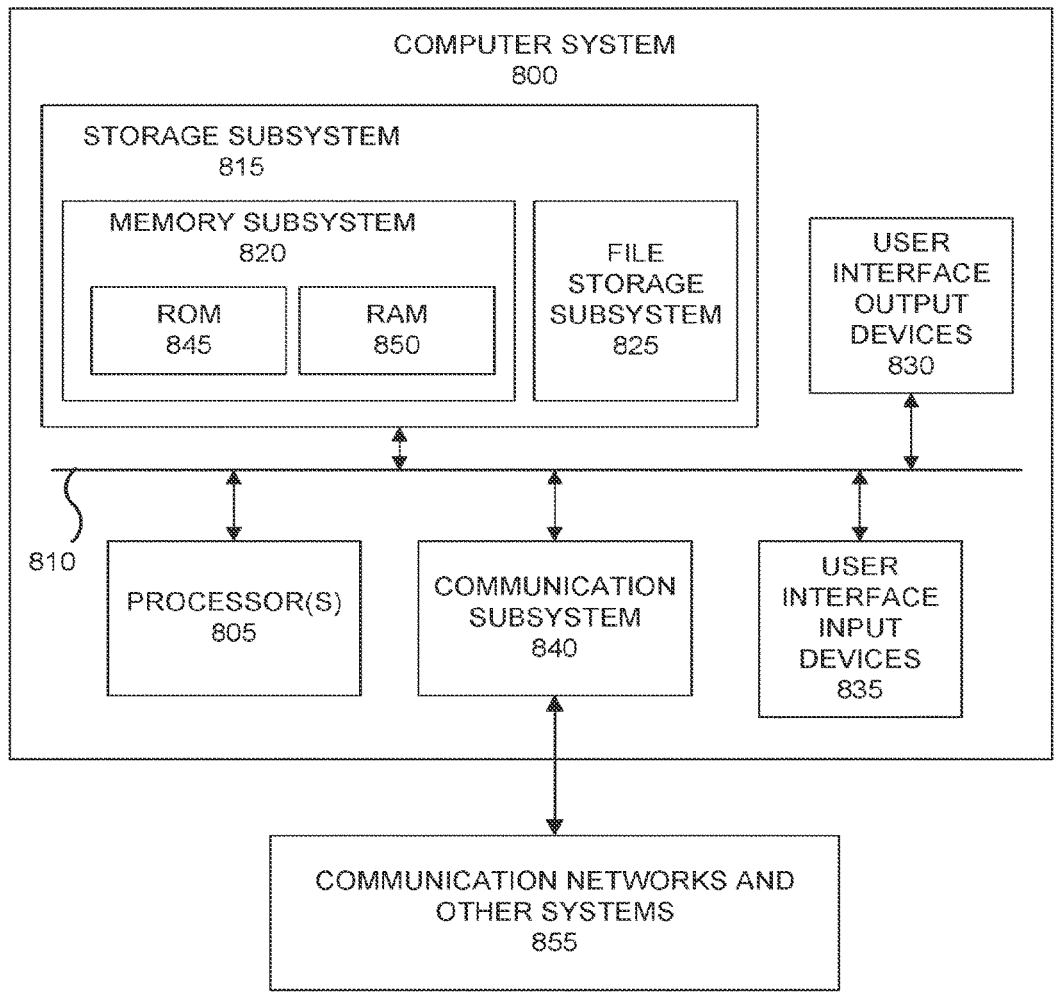
FIG. 8 is a block diagram of an example computer apparatus to perform the operations of FIGS. 1-6 for communicating with a memory device such as depicted in FIG. 7.

FIG. 8 is a block diagram of an example computer apparatus to perform the operations of FIGS. 1-6 for communicating with a memory device such as depicted in FIG. 7. For instance, FIG. 8 is a block diagram of a computer system 800 sufficient to perform as a host device (such as the host device 706) and sufficient to perform the operations of FIGS. 1-6 and/or other operations. The computer system 800 may incorporate embodiments of the presently disclosed technology and perform the operations described herein. The computer system 800 typically may include one or more processors 805, a system bus 810, storage subsystem 815 that includes a memory subsystem 820 and a file storage subsystem 825, user interface output devices 830, user interface input devices 835, a communications subsystem 840, and other components, all of which may be operatively coupled to each other.

In various embodiments, the computer system 800 may include computer components such as the one or more processors 805. The file storage subsystem 825 can include a variety of memory storage devices, such as a read only memory (ROM) 845 and random access memory (RAM) 850 in the memory subsystem 820, and direct access storage devices such as disk drives. As noted, the direct access storage device may comprise a block erasure-avoiding data device that operates as described herein.

The user interface output devices 830 can comprise a variety of devices including flat panel displays, touchscreens, indicator lights, audio devices, force feedback devices, or other devices. The user interface input devices 835 can comprise a variety of devices including a computer mouse, trackball, trackpad, joystick, wireless remote, drawing tablet, voice command system, eye tracking system, or other devices. The user interface input devices 835 may typically allow a user to select objects, icons, text and the like that appear on the user interface output devices 830 via a command such as a click of a button or the like.

Embodiments of the communication subsystem 840 typically include an Ethernet card, a modem (telephone, satellite, cable, ISDN), (asynchronous) digital subscriber line (DSL) unit, FireWire (IEEE 1394) interface, USB interface, or other devices. For example, the communications subsystem 840 may be coupled to communications networks and other external systems 855 (e.g., a network such as a LAN or the Internet), to a FireWire bus, or the like. In other embodiments, the communications subsystem 840 may be physically integrated on the motherboard of the computer system 800, may include a software program, such as soft DSL, or the like.

The RAM 850 and the file storage subsystem 825 are examples of tangible non-transitory media configured to store data such as error correction code parameters, codewords, and program instructions to perform the operations described herein in response to execution by the one or more processors, including executable computer code, human readable code, or the like. Other types of tangible non-transitory media may include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 825 may include reader subsystems that can transfer data from the program product media to the storage subsystem 815 for operation and execution by the processors 805.

The computer system 800 may also include software that enables communications over a network (e.g., the communications network and other systems 855) such as the DNS, TCP/IP, UDP/IP, and HTTP/HTTPS protocols, and the like. In other embodiments, other communications software and transfer protocols may also be used, for example IPX, or the like.

Many other hardware and software configurations are suitable for use with the presently disclosed technology. For example, the computer system 800 may have a desktop, portable, rack-mounted, or tablet configuration. Additionally, the computer system 800 may be a series of networked computers. Further, a variety of microprocessors are contemplated and are suitable for the one or more processors 805, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; or others. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, or others. In still other embodiments, the techniques described above may be implemented upon a chip or an auxiliary processing board (e.g., a programmable logic device or graphics processor unit).

The presently disclosed technologies can be implemented in the form of control logic in software or hardware or a combination of both. The control logic may be stored in an information storage medium as a plurality of instructions adapted to direct an information-processing device to perform a set of operations disclosed in embodiments of the presently disclosed technology. Based on the disclosure and teachings provided herein, other ways and/or methods to implement the presently disclosed technology are possible.

The block erasure-avoiding schemes described herein can be implemented in a variety of systems for encoding and decoding data for transmission and storage. That is, codewords may be received from a source over an information channel according to a block erasure-avoiding scheme and may be decoded into their corresponding data values and may be provided to a destination, such as a memory or a processor, and data values for storage or transmission may be received from a source over an information channel and may be encoded into a block erasure-avoiding scheme.

Figure 9:
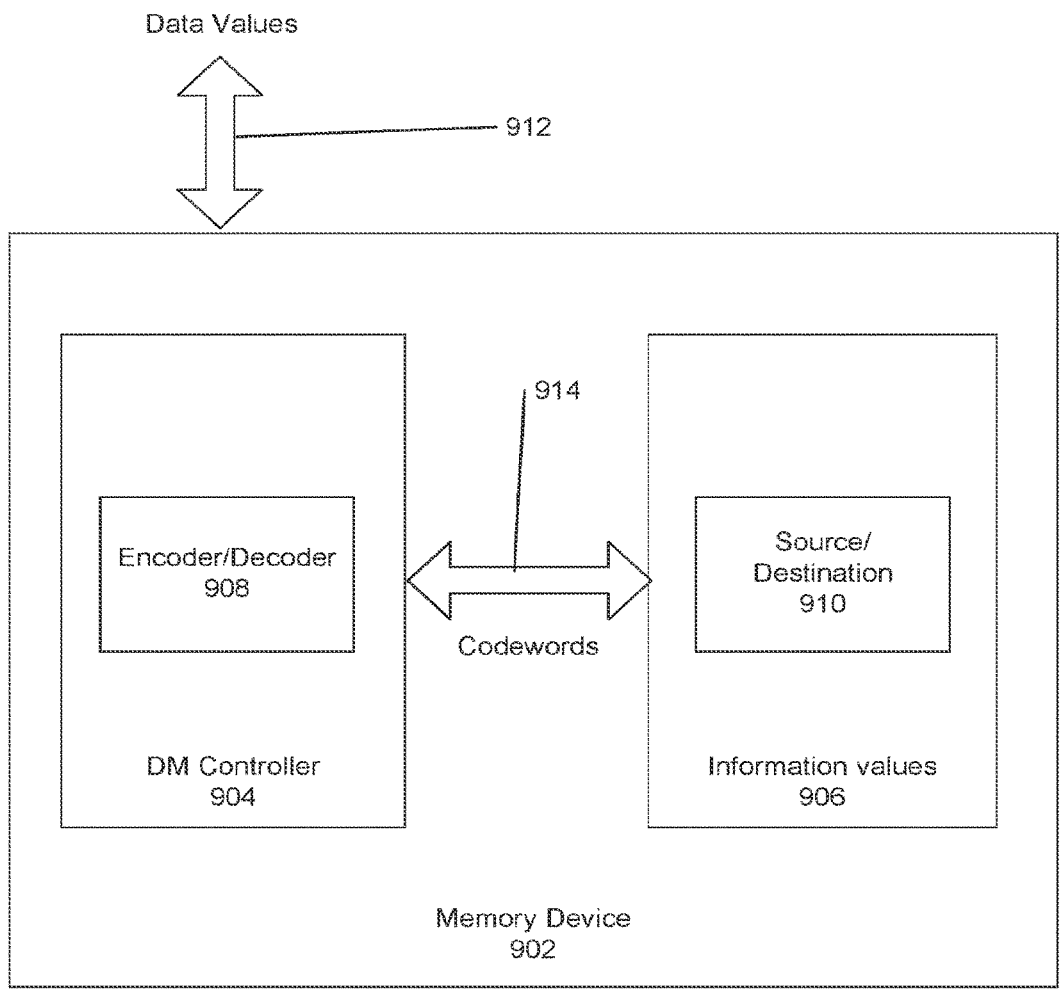
FIG. 9 is a block diagram that shows data flow in an example memory device that operates according to various schemes described herein.

The operations of encoding and decoding data according to a block erasure-avoiding scheme can be illustrated as in FIG. 9, which shows data flow in a memory device 902 that operates according to the block erasure-avoiding schemes described herein. In FIG. 9, the device includes a data modulation (DM) controller 904 that may be configured to store and retrieve information values 906 using a block erasure-avoiding scheme. The DM controller 904 may include an encoder/decoder 908 for encoding data values into codewords and decoding codewords into data values. The DM controller 904 may encode data values and may provide codewords to a source/destination block 910, and may decode codewords from the source/destination block 910 and may provide corresponding data values. The two-way nature of the data flow is indicated by the double-ended arrows labeled "data values" 912 and "codewords" 914. The DM controller 904 may include interfaces through which the DM controller 904 may receive and may provide the data values and the information values (codewords). The arrows 912, 914 represent the interfaces through which the data values and codewords may be received and provided, and which collectively may comprise a communications channel.

The information values 906 may comprise the component(s) for physically representing data comprising the data values and codewords. For example, the information values 906 may represent charge levels of memory cells, such that multiple cells may be configured to operate as a virtual cell in which charge levels of the cells may determine a permutation of the block erasure-avoiding schemes. Data values may be received and encoded by the encoder/decoder 908 to permutations of a block erasure-avoiding scheme and charge levels of cells may be adjusted accordingly, and codewords may be determined by the encoder/decoder 908 according to cell charge levels, from which a corresponding data value may be determined. Alternatively or additionally, the information values 906 may represent features of a transmitted signal, such as signal frequency, magnitude, or duration, such that the cells or bins may be defined by the signal features and determine a permutation of the block erasure-avoiding schemes. Other schemes for physical representation of the cells are possible in view of the description herein.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. This disclosure is not limited to particular methods, reagents, compounds compositions or biological systems, which can, of course, vary. The terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense as would be understood for the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense as would be understood for the convention (e.g., "a system having at least one of A, B, or C" would include but not be limited to systems that have A alone, B alone, C alone, A and B together, A and C together, B and C together, and/or A, B, and C together, etc.). Any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, the disclosure is also thereby described in terms of any individual member or subgroup of members of the Markush group.

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. All language such as "up to," "at least," "greater than," "less than," and the like include the number recited and refer to ranges which can be subsequently broken down into subranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the claims listed below.

APPENDIX A

In this appendix, Theorem 6 is proved. A similar result was proved in Heegard, "On The Capacity Of Permanent Memory," supra; Theorem 4. A different proof is shown here. An upper bound on the capacity can be obtained by assuming that the state information may be available also to the decoder. In this case, the coding scheme may ignore a fraction β of the cells, and the rest of the cells may be coded according to a binary symmetric channel with an input cost constraint. For this channel:

$$H(Y|X) = h(\alpha)p(x=0) + h(\alpha)p(x=1) = h(\alpha).$$

Furthermore:

$$p_Y(1) = p_{Y|X}(1 \mid 0)p_X(0) + p_{Y|X}(1 \mid 1)p_X(1)$$
$$= \alpha(1 - p_X(1)) + (1 - \alpha)p_X(1)$$
$$= \alpha * p_X(1).$$

To increase the cost constraint on the cells with state $s_i=0$, it is possible to assign a channel input $x_i=0$ for the cells with state $s_i=1$. This way, the cost constraint on the cells with state $s_i=0$ may become $\varepsilon = B/(1-\beta)$. Since $p_X(1) \leq \varepsilon \leq \frac{1}{2}$ and $\alpha * p_X(1)$ may be increasing in $p_X(1)$ below $\frac{1}{2}$, it follows that $p_Y(1) \leq \alpha * \varepsilon \leq \frac{1}{2}$ and therefore also that $H(Y) \leq h(\alpha * \varepsilon)$. So as a result:

$$\max_{p(x)} I(X;Y) = \max_{p(x)} (H(Y) - H(Y \mid X)) = h(\alpha * \varepsilon) - h(\alpha).$$

This completes the proof of the upper bound.

The lower bound may be obtained by considering the selections $v=\{0,1\}$, $x(v,0)=v, x(v,1)=0$ and:

$$p_{V|S}(1 \mid 0) = \varepsilon, \; p_{V|S}(1 \mid 1) = \frac{\varepsilon(1-\alpha)}{\varepsilon * \alpha}, \quad (14)$$

and calculating the rate expression directly. Notice first that the cost constraint may be met since:

$$p_X(1) = p_X(1 \mid 0)p_S(0) = p_V(1 \mid 0)p_S(0) = \varepsilon(1-\beta) = B.$$

Next, show that $H(V|S) - H(V|V) = (1-\beta)[H(\alpha * \varepsilon) - H(\alpha)]$. Given the distributions $p_S$ and $p_{V|S}$, the conditional entropy $H(V|S)$ may be:

$$H(V \mid S) = \sum_{s \in \{0,1\}} p_S(s) H(V \mid S = s)$$
$$= p_S(0) H(V \mid S = 0) + p_S(1) H(V \mid S = 1)$$
$$= (1-\beta)H(\varepsilon) + \beta H\left(\frac{\varepsilon(1-\alpha)}{\varepsilon * \alpha}\right)$$

To compute the conditional entropy $H(V|Y)$, first compute the probability distribution of the memory output Y as follows:

$$p_Y(0) = \sum_{v \in \{0,1\}} p_{Y|VS}(0 \mid v, 0) p_{V|S}(v \mid 0) p_S(0)$$
$$= (1-\beta)((1-\alpha)(1-\varepsilon) + \alpha\varepsilon)$$
$$= (1-\beta)(\alpha * (1-\varepsilon)),$$
$$p_Y(1) = 1 - p_Y(0)$$
$$= (1-\beta)(\alpha * \varepsilon) + \beta.$$

The conditional distribution $p_{V|Y}$ is given by:

$$p_{V|Y}(1 \mid 0) = \sum_{s \in \{0,1\}} p_{VS|Y}(1, s \mid 0)$$
$$= \sum_{s \in \{0,1\}} \frac{p_{Y|VS}(0 \mid 1, s) p_{VS}(1, s)}{p_Y(0)}$$
$$= \sum_{s \in \{0,1\}} \frac{p_{Y|VS}(0 \mid 1, s) p_{V|S}(1 \mid s) p_S(s)}{p_Y(0)}$$
$$= \frac{\alpha\varepsilon}{\alpha * (1-\varepsilon)},$$

$$p_{V|Y}(1 \mid 1) = \sum_{s \in \{0,1\}} p_{VS|Y}(1, s \mid 1)$$
$$= \sum_{s \in \{0,1\}} \frac{p_{Y|VS}(1 \mid 1, s) p_{VS}(1, s)}{p_Y(1)}$$
$$= \sum_{s \in \{0,1\}} \frac{p_{Y|VS}(1 \mid 1, s) p_{V|S}(1 \mid s) p_S(s)}{p_Y(1)}$$
$$= \frac{(1-\alpha)\varepsilon(1-\beta) + \frac{\varepsilon(1-\alpha)}{\varepsilon * \alpha}\beta}{(1-\beta)(\alpha * \varepsilon) + \beta}$$
$$= \frac{\varepsilon(1-\alpha)}{\varepsilon * \alpha}.$$

Therefore:

$$H(V \mid Y) = \sum_{y \in \{0,1\}} p_Y(y) H(V \mid Y = y)$$
$$= (1-\beta)(\alpha * (1-\varepsilon)) H\left(\frac{\alpha\varepsilon}{\alpha * (1-\varepsilon)}\right) +$$
$$(\beta + (1-\beta)(\alpha * \varepsilon)) H\left(\frac{\varepsilon(1-\alpha)}{\varepsilon * \alpha}\right),$$

and then:

$$H(V \mid S) - H(V \mid Y) = (1-\beta)\left[H(\varepsilon) - (\alpha * (1-\varepsilon))H\left(\frac{\alpha\varepsilon}{\alpha * (1-\varepsilon)}\right) - \right.$$
$$\left. (\alpha * \varepsilon)H\left(\frac{\varepsilon(1-\alpha)}{\varepsilon * \alpha}\right)\right]$$
$$= (1-\beta)\left[H(\varepsilon) + \alpha\varepsilon\log_2 \frac{\alpha\varepsilon}{\alpha * (1-\varepsilon)} + \right.$$
$$(1-\alpha)(1-\varepsilon)\log_2 \frac{(1-\alpha)(1-\varepsilon)}{\alpha * (1-\varepsilon)} +$$
$$\left. \alpha(1-\varepsilon)\log_2 \frac{\alpha(1-\varepsilon)}{\alpha * \varepsilon} + \varepsilon(1-\alpha)\log_2 \frac{\varepsilon(1-\alpha)}{\alpha * \varepsilon}\right]$$
$$= (1-\beta)[H(\alpha * \varepsilon) + H(\varepsilon) + \alpha\varepsilon\log_2(\alpha\varepsilon) +$$
$$(1-\alpha)(1-\varepsilon)\log_2(1-\alpha)(1-\varepsilon) +$$
$$\alpha(1-\varepsilon)\log_2\alpha(1-\varepsilon) + \varepsilon(1-\alpha)\log_2\varepsilon(1-\alpha)]$$
$$= (1-\beta)[H(\alpha * \varepsilon) + H(\varepsilon) - H(\alpha) - H(\varepsilon)]$$
$$= (1-\beta)[H(\alpha * \varepsilon) - H(\alpha)].$$

APPENDIX B

In this appendix Lemma 6a is proved. It can be shown that, using the functions of Theorem 6, there may exist a DMC W: $\{0,1\}^2 \to \{0,1\}^2$ such that:

$$p_{S|V}(s|v) = \sum_{y \in \{0,1\}^2} p_{Y|V}(y|v) W(s|y). \quad (15)$$

To identify such channel W, first notice that:

$$p_{Y|V,S}(1|v,0) p_{V|S}(x|0) = (\varepsilon * \alpha) p_{V|S}(x|1). \quad (16)$$

Equation (16) may follow directly from Equation (9) since:

$$\frac{p_{Y|V,S}(1|0,0) p_{V|S}(0|0)}{p_{V|S}(0|1)} = \frac{\alpha(1-\varepsilon)}{\frac{\alpha(1-\varepsilon)}{\varepsilon * \alpha}} = \varepsilon * \alpha,$$

$$\frac{p_{Y|V,S}(1|1,0) p_{V|S}(1|0)}{p_{V|S}(1|1)} = \frac{(1-\alpha)\varepsilon}{\frac{(1-\alpha)\varepsilon}{\varepsilon * \alpha}} = \varepsilon * \alpha.$$

Next, assume that $$\frac{p_{V,S}(v,1)}{p_{V,Y}(v,1)} = \frac{\beta}{(\varepsilon * \alpha)(1-\beta) + \beta}$$

for any $v \in \{0,1\}$, and therefore that $$\frac{p_{V,S}(v,1)}{p_{V,Y}(v,1)} \in [0,1].$$

This follows from:

$$\frac{p_{V,S}(v,1)}{p_{V,Y}(v,1)} \stackrel{(a)}{=} \frac{p_{V|S}(v|1) p_S(1)}{p_{Y,V|S}(1,v|0) p_S(0) + p_{Y,V|S}(1,v|1) p_S(1)}$$

$$\stackrel{(b)}{=} p_{V|S}(v|1)\beta / [p_{Y|V,S}(1|v,0) p_{V|S}(v|0)(1-\beta) +$$
$$p_{Y|V,S}(1|v,1) p_{V|S}(x|1)\beta]$$

$$\stackrel{(c)}{=} \frac{p_{V|S}(v|1)\beta}{(\varepsilon * \alpha) p_{V|S}(v|1)(1-\beta) + p_{V|S}(v|1)\beta}$$

$$= \frac{\beta}{(\varepsilon * \alpha)(1-\beta) + \beta},$$

where (a) follows from the law of total probability, (b) follows from the definition of conditional probability, and (c) follows from Equations (8) and (16).

Since $$\frac{p_{V,S}(v,1)}{p_{V,Y}(v,1)}$$

may not be a function of x and may be in [0,1], W can be provided as per the following:

$$W(s|y) \triangleq \begin{cases} 1 & \text{if } (s,y) = (0,0) \\ 1 - \frac{p_{S|V}(1|v)}{p_{Y|V}(1|v)} & \text{if } (s,y) = (0,1) \\ \frac{p_{S|V}(1|v)}{p_{Y|V}(1|v)} & \text{if } (s,y) = (1,1) \\ 0 & \text{if } (s,y) = (1,0) \end{cases}.$$

Next, show that Eq. (15) holds for W provided above:

$$\sum_{y \in \{0,1\}} p_{Y|V}(y|v) W(s|y) = p_{Y|V}(0|v) W(s|0) + p_{Y|V}(1|v) W(s|1)$$

$$= \left[ p_{Y|V}(0|v) + p_{Y|V}(1|v)\left(1 - \frac{p_{S|V}(1|v)}{p_{Y|V}(1|v)}\right) \right]$$
$$1[s=0] + p_{Y|V}(1|v)1[s=1]$$

$$= [1 - p_{S|V}(1|v)]1[s=0] + p_{Y|V}(1|v)1[s=1]$$

$$= p_{S|V}(0|v)1[s=0] + p_{Y|V}(1|v)1[s=1]$$

$$= p_{S|V}(s|v).$$

So, the channel W may satisfy Equation (15) and thus the lemma holds.

APPENDIX C

In this appendix Theorem 7 is proved. The complexity claim of Theorem 7 is explained in Honda and Yamamoto, "Polar Coding Without Alphabet Extension For Asymmetric Models," supra, at Section III.B. The proof may begin with the asymptotic rate of Construction B. It is intended to show that $\lim_{n \to \infty}(1/n) |\mathcal{L}_{V|Y}^c \cap \mathcal{H}_{V|S}^c| = 0$. Since $p_{S|V}$ may be degraded with respect to $p_{Y|V}$, it follows from N. Goela, E. Abbe, and M. Gastpar, "Polar Codes For Broadcast Channels", in Proc. *IEEE Int. Symp. on Information Theory* (ISIT), July 2013, pp. 1127-1131, Lemma 4, that $\mathcal{L}_{V|S} \subseteq \mathcal{L}_{V|Y}$, and therefore that $\mathcal{L}_{V|S}^c \supseteq \mathcal{L}_{V|Y}^c$. So next, it may be true that:

$$\lim_{n \to \infty}(1/n)|\mathcal{L}_{V|Y}^c \cap \mathcal{H}_{V|S}^c| \leq \lim_{n \to \infty}(1/n)|\mathcal{L}_{V|S}^c \cap \mathcal{H}_{V|S}^c| = 0,$$

where the equality follows by the definition of the sets. To complete the proof of the theorem, in the next subsection it is shown that the cost may meet the constraint, and then in Subsection B, Probability of Decoding Error, it is shown that the decoding error probability may vanish.

A. Expected Input Cost

Provide:

$$b^n(X) = \sum_{i=1}^n b(X_i).$$

For a state vector $s_{[n]}$ and the encoding rule (10), each vector $u_{[n]}$ appears with probability:

$$\left( \prod_{i \in \mathcal{H}_{V|S}^c} p_{U_i | U_{[i-1]}, S_{[n]}}(u_i | u_{[i-1]}, s_{[n]}) \right) 2^{-|\mathcal{H}_{V|S} \cap \mathcal{L}_{V|Y}|} \cdot 1\left[ \bigcap_{i \in \mathcal{H}_{V|S} \cap \mathcal{L}_{V|Y}^c} \{f_i = u_i\} \right].$$

The expected cost for a frozen vector $f_{[|\mathcal{H}_{V|S} \cap \mathcal{L}_{V|Y}^c|]}$ is expressed as:

$$E(b^n(X)) = \sum_{u_1^n, s_1^n} p_{S_{[n]}}(s_{[n]}) \left( \prod_{i \in \mathcal{H}_{V|S}} p_{U_i|U_{[i-1]}, S_{[n]}}(u_i | u_{[i-1]}, s_{[n]}) \right)$$

$$2^{-|\mathcal{H}_{V|S} \cap \mathcal{L}_{V|Y}|} \cdot 1 \left[ \bigcap_{i \in \mathcal{H}_{V|S} \cap \mathcal{L}_{V|Y}^c} \{f_i = u_i\} \right] b^n(u_{[n]} G_n),$$

Now assume that the frozen vector is drawn uniformly, and denote its random vector character by $F_{[|\mathcal{H}_{V|S} \cap \mathcal{L}_{V|Y}^c|]}$. Next, calculate the expectation of the cost over the random frozen vector, and show that this expectation satisfies the constraint. The same can be shown for the probability of error, and it can be shown that there exists at least one frozen vector that may satisfy both the constraint and the low error probability. The expectation may be obtained as:

$$E_{F_{[|\mathcal{H}_{V|S} \cap \mathcal{L}_{V|Y}^c|]}}(b^n(X)) =$$

$$\sum_{u_1^n, s_1^n} p_{S_{[n]}}(s_{[n]}) \left( \prod_{i \in \mathcal{H}_{V|S}^c} p_{U_i|U_{[i-1]}, S_{[n]}}(u_i | u_{[i-1]}, s_{[n]}) \right) 2^{-|\mathcal{H}_{V|S}|} b^n(u_{[n]} G_n).$$

Provide the joint pmf:

$$q_{S_{[n]}, U_{[n]}} \equiv p_{S_{[n]}}(s_{[n]}) \left( \prod_{i \in \mathcal{H}_{V|S}^c} p_{U_i|U_{[i-1]}, S_{[n]}}(u_i | u_{[i-1]}, s_{[n]}) \right) 2^{-|\mathcal{H}_{V|S}|}.$$

Then:

$$E_{F_{[|\mathcal{H}_{V|S} \cap \mathcal{L}_{V|Y}^c|]}}(b^n(X)) = E_{q_{S_{[n]}, U_{[n]}}}[b^n(U_{[n]} G_n)] \leq$$

$$E_{p_{S_{[n]}, U_{[n]}}}[b^n(U_{[n]} G_n)] + \max_x b(x) \| p_{S_{[n]}, U_{[n]}} - q_{S_{[n]}, U_{[n]}} \|.$$

To prove that $$E_{F_{[|\mathcal{H}_{V|S} \cap \mathcal{L}_{V|Y}^c|]}}(b^n(X)) \leq B + 2^{-n^{1/2-\delta}},$$

it next is shown that: $\| p_{U_{[n]}, S_{[n]}} - q_{U_{[n]}, S_{[n]}} \| \leq 2^{-n^{1/2-\delta}}$. To show this, a slightly stronger relation is proved that can be used also for the proof of the probability of decoding error. First, the joint pmf is provided:

$$q_{S_{[n]}, U_{[n]}, Y_{[n]}} \equiv q_{U_{[n]}, S_{[n]}}(u_{[n]}, s_{[n]}) p_{Y_{[n]} | U_{[n]}, S_{[n]}}(y_{[n]} | u_{[n]}, s_{[n]}).$$

Then notice that:

$$2 \| p_{U_{[n]}, S_{[n]}} - q_{U_{[n]}, S_{[n]}} \| = \sum_{u_{[n]}, s_{[n]}} |p(u_{[n]}, s_{[n]}) - q(u_{[n]}, s_{[n]})| =$$

$$\sum_{u_{[n]}, s_{[n]}} \left| \sum_{y_{[n]}} [p(s_{[n]}, u_{[n]}, y_{[n]}) - q(s_{[n]}, u_{[n]}, y_{[n]})] \right| \leq$$

-continued $$\sum_{s_{[n]}, u_{[n]}, y_{[n]}} |p(s_{[n]}, u_{[n]}, y_{[n]}) - q(s_{[n]}, u_{[n]}, y_{[n]})| =$$

$$2 \| p_{S_{[n]}, U_{[n]}, Y_{[n]}} - q_{S_{[n]}, U_{[n]}, Y_{[n]}} \|,$$

where the inequality follows from the triangle inequality. And the proof of the expected cost may be completed with the following lemma, designated Lemma 7a in this proof that can be related to Theorem 7. The Lemma 7a may be useful also for the probability of decoding error.

Lemma 7a.

$$\| p_{S_{[n]}, U_{[n]}, Y_{[n]}} - q_{S_{[n]}, U_{[n]}, Y_{[n]}} \| \leq 2^{-n^{1/2-\delta}}. \qquad (17)$$

Proof: Let $D(\cdot \| \cdot)$ denote the relative entropy. Then:

$$2 \| p_{S_{[n]}, U_{[n]}, Y_{[n]}} - q_{S_{[n]}, U_{[n]}, Y_{[n]}} \| =$$

$$\sum_{s_{[n]}, u_{[n]}, y_{[n]}} |p(s_{[n]}, u_{[n]}, y_{[n]}) - q(s_{[n]}, u_{[n]}, y_{[n]})| \stackrel{(a)}{=}$$

$$\sum_{s_{[n]}, u_{[n]}, y_{[n]}} |p(u_{[n]} | s_{[n]}) - q(u_{[n]} | s_{[n]})| p(s_{[n]}) p(y_{[n]} | u_{[n]}, s_{[n]}) \stackrel{(b)}{=}$$

$$\sum_{s_{[n]}, u_{[n]}, y_{[n]}} \left| \prod_{i=1}^n p(u_i | u_{[i-1]}, s_{[n]}) - \prod_{i=1}^n q(u_i | u_{[i-1]}, s_{[n]}) \right|$$

$$p(s_{[n]}) p(y_{[n]} | u_{[n]}, s_{[n]}) \stackrel{(c)}{=}$$

$$\sum_{s_{[n]}, u_{[n]}, y_{[n]}} \left| \sum_i [p(u_i | u_{[i-1]}, s_{[n]}) - q(u_i | u_{i-1}, s_{[n]})] \right|$$

$$p(s_{[n]}) \prod_{j=1}^{i-1} p(u_j | u_1^{j-1}, s_{[n]}) \cdot$$

$$\prod_{j=i+1}^n q(u_j | u_1^{j-1}, s_{[n]}) p(y_{[n]} | u_{[n]}, s_{[n]}) \stackrel{(d)}{\leq}$$

$$\sum_{i \in \mathcal{H}_{V|S}} \sum_{s_{[n]}, u_{[n]}, y_{[n]}} |p(u_i | u_{[i-1]}, s_{[n]}) - q(u_i | u_{[i-1]}, s_{[n]})|$$

$$p(s_{[n]}) \prod_{j=1}^{i-1} p(u_j | u_1^{j-1}, s_{[n]}) \cdot$$

$$\prod_{j=i+1}^n q(u_j | u_{[j-1]}, s_{[n]}) p(y_{[n]} | u_{[n]}, s_{[n]}) =$$

$$\sum_{i \in \mathcal{H}_{V|S}} \sum_{s_{[n]}, u_{[i]}} |p(u_i | u_{[i-1]}, s_{[n]}) - q(u_i | u_{[i-1]}, s_{[n]})|$$

$$\prod_{j=1}^{i-1} p(u_j | u_1^{j-1}, s_{[n]}) p(s_{[n]}) \stackrel{(e)}{=}$$

$$\sum_{i \in \mathcal{H}_{V|S}} \sum_{s_{[n]}, u_{[i-1]}} p(u_{[i-1]}, s_{[n]}) 2 \| p_{U_i | U_{[i-1]} = u_{[i-1]}, S_{[i-1]} = s_{[i-1]}} -$$

$$q_{U_i | U_{[i-1]} = u_{[i-1]}, S_{[i-1]} = s_{[i-1]}} \| \stackrel{(f)}{\leq}$$

$$\sum_{i \in \mathcal{H}_{V|S}} \sum_{s_{[n]}, u_{[i-1]}} p(u_{[i-1]}, s_{[n]}) \sqrt{2 \ln 2}$$

-continued $$\sqrt{D\left(\begin{array}{c}p_{U_i|U_{[i-1]}=u_{[i-1]},S_{[i-1]}=s_{[i-1]}}\|\\q_{U_i|U_{[i-1]}=u_{[i-1]},S_{[i-1]}=s_{[i-1]}}\end{array}\right)} \overset{(g)}{\leq}$$

$$\sum_{i\in\mathcal{H}_{V|S}}\sqrt{(2\ln 2)\sum_{s_{[n]},u_{[i-1]}} p(u_{[i-1]},s_{[n]})D\left(\begin{array}{c}p_{U_i|U_{[i-1]}=u_{[i-1]},S_{[i-1]}=s_{[i-1]}}\|\\q_{U_i|U_{[i-1]}=u_{[i-1]},S_{[i-1]}=s_{[i-1]}}\end{array}\right)}$$

$$= \sum_{i\in\mathcal{H}_{V|S}}\sqrt{(2\ln 2)D(p_{U_i}\|q_{U_i}\mid U_{[i-1]},S_{[i-1]})} \overset{(h)}{=}$$

$$\sum_{i\in\mathcal{H}_{V|S}}\sqrt{(2\ln 2)[1 - H(U_i|U_{[i-1]},S_{[n]})]},$$

where:
(a) follows from the fact that $p(s_{[n]})=q(s_{[n]})$ and $p(y_{[n]}|u_{[n]}, s_{[n]})=q(y_{[n]}|u_{[n]}, s_{[n]})$,
(b) follows from the chain rule,
(c) follows from the telescoping expansion $$B_{[n]} - A_{[n]} = \sum_{i=1}^{n} A_{[i-1]}B_{[i:n]} - \sum_{i=1}^{n} A_{[i]}B_{[i+1:n]} = \sum_{i=1}^{n} (B_i - A_i)A_{[i-1]}B_{[i+1:n]},$$

where $A_{[j:k]}$ and $B_{[j:k]}$ denote the products $\Pi_{i=j}^{k} A_i$ and $\Pi_{i=j}^{k} B_i$, respectively,
(d) follows from the triangular inequality and the fact that $p(u_i|u_1^{i-1},s_{[n]})=q(u_i|u_1^{i-1},s_{[n]})$ for all $i\in\mathcal{H}_{V|S}^c$,
(e) follows from the chain rule again,
(f) follows from Pinsker's inequality (see, e.g., supra, Cover and Thomas, *Elements of Information Theory*, Lemma 11.6.1),
(g) follows from Jensen's inequality and
(h) follows from the facts that $q(u_i|u_{[i-1]})=\frac{1}{2}$ for $i\in\mathcal{H}_{V|S}$ and from Goela and Abbe, "Polar Codes For Broadcast Channels," supra, at Lemma 10].

Now if $i\in\mathcal{H}_{V|S}$, then:

$$1-H(U_i|U_{[i-1]},S_{[n]})\leq 1-[Z(U_{[i-1]},S_{[n]})]^2 \leq 2^{-2n^{1/2-\delta}}, \quad (18)$$

where the first inequality may follow from Proposition 3, and the second inequality may follow from the fact the i is in $\mathcal{H}_{V|S}$. This completes the proof of the lemma.

B. Probability of Decoding Error

Let $\varepsilon_i$ be the set of pairs of vectors $(u_{[n]}, y_{[n]})$ such that $\hat{u}_{[n]}$ may be a result of decoding $y_{[n]}$, and $\hat{u}_{[i]}$ may satisfy both $\hat{u}_{[i-1]}=u_{[i-1]}$ and $\hat{u}_i\neq u_i$. The block decoding error event may be given by $\varepsilon\equiv\bigcup_{i\in\mathcal{L}_{V|Y}}\varepsilon_i$. Under decoding given in (11) with an arbitrary tie-breaking rule, every pair $(u_{[n]}, y_{[n]})\in\varepsilon_i$ may satisfy:

$$p_{U_i|U_{[i-1]},Y_{[n]}}(u_i|u_{[i-1]},y_{[n]})\leq p_{U_i|U_{[i-1]},Y_{[n]}}(u_i\oplus 1|u_{[i-1]},y_{[n]}) \quad (19)$$

Consider the block decoding error probability $p_e(f_{[|\mathcal{H}_{V|S}\cap\mathcal{L}_{V|Y}^c|]})$ for a frozen vector $f_{[|\mathcal{H}_{V|S}\cap\mathcal{L}_{V|Y}^c|]}$ For a state vector $s_{[n]}$ and the encoding rule (10), each vector $u_{[n]}$ may appear with probability:

$$\left(\prod_{i\in\mathcal{H}_{V|S}^c} p_{U_i|U_{[i-1]},S_{[n]}}(u_i|u_{[i-1]},s_{[n]})\right)2^{-|\mathcal{H}_{V|S}\cap\mathcal{L}_{V|Y}|}\cdot 1\left[\bigcap_{i\in\mathcal{H}_{V|S}\cap\mathcal{L}_{V|Y}^c}\{f_i = u_i\}\right].$$

By the definition of conditional probability and the law of total probability, the probability of error $p_e(f_{[|\mathcal{H}_{V|S}\cap\mathcal{L}_{V|Y}^c|]})$ may be given by:

$$p_e\left(f_{[|\mathcal{H}_{V|S}\cap\mathcal{L}_{V|Y}^c|]}\right) =$$

$$\sum_{u_1^n,s_1^n,y_1^n} p_{S_{[n]}}(s_{[n]})\left(\prod_{i\in\mathcal{H}_{V|S}^c} p_{U_i|U_{[i-1]},S_{[n]}}(u_i|u_{[i-1]},s_{[n]})\right)2^{-|\mathcal{H}_{V|S}\cap\mathcal{L}_{V|Y}|}\cdot$$

$$1\left[\bigcap_{i\in\mathcal{H}_{V|S}\cap\mathcal{L}_{V|Y}^c}\{f_i = u_i\}\right]p_{Y_{[n]}|U_{[n]},S_{[n]}}(y_{[n]}|u_{[n]},s_{[n]})1[(u_{[n]},y_{[n]})\in\varepsilon].$$

As with the cost constraint, it may be assumed that the frozen vector can be drawn uniformly, denoting its character as a random vector by $F_{[|\mathcal{H}_{V|S}\cap\mathcal{L}_{V|Y}^c|]}$ The expectation may be obtained as:

$$E_{F_{[|\mathcal{H}_{V|S}\cap\mathcal{L}_{V|Y}^c|]}}[p_e] = \sum_{u_1^n,s_1^n,y_1^n} p_{S_{[n]}}(s_{[n]})\left(\prod_{i\in\mathcal{H}_{V|S}^c} p_{U_i|U_{[i-1]},S_{[n]}}(u_i|u_{[i-1]},s_{[n]})\right)$$

$$2^{-|\mathcal{H}_{V|S}|}\cdot p_{Y_{[n]}|U_{[n]},S_{[n]}}(y_{[n]}|u_{[n]},s_{[n]})1[(u_{[n]},y_{[n]})\in\varepsilon].$$

Then:

$$E_{F_{[|\mathcal{H}_{V|S}\cap\mathcal{L}_{V|Y}^c|]}}[p_e] =$$

$$q_{U_{[n]},Y_{[n]}}(\varepsilon) \leq \|q_{U_{[n]},Y_{[n]}} - p_{U_{[n]},Y_{[n]}}\| + p_{U_{[n]},Y_{[n]}}(\varepsilon) \leq$$

$$\|q_{U_{[n]},Y_{[n]}} - p_{U_{[n]},Y_{[n]}}\| + \sum_{i\in\mathcal{L}_{V|Y}} p_{U_{[n]},Y_{[n]}}(\varepsilon_i),$$

where the first inequality may follow from the triangle inequality. Each term in the summation may be bounded by:

$$p_{U_{[n]},Y_{[n]}}(\varepsilon_i) \leq$$

$$\sum_{u_{[i]},y_{[n]}} p(u_{[i]},y_{[n]})1[p(u_i|u_{[i-1]},y_{[n]}) \leq p(u_i\oplus 1|u_{[i-1]},y_{[n]})] \leq$$

$$\sum_{u_{[i]},y_{[n]}} p(u_{[i-1]},y_{[n]})p(u_i|u_{[i-1]},y_{[n]})\sqrt{\frac{p(u_i\oplus 1|u_{[i-1]},y_{[n]})}{p(u_i|u_{[i-1]},y_{[n]})}} =$$

$$Z(U_i\mid U_{[i-1]},Y_{[n]}) \leq 2^{-n^{1/2-\delta}},$$

where the last inequality may follow from the fact that i may belong to the set $\mathcal{L}_{V|Y}$.

To prove that $$E_{f_{[|\mathcal{H}_{V|S}\cap\mathcal{L}_{V|Y}^c|]}}\left[p_e\left(f_{[|\mathcal{H}_{V|S}\cap\mathcal{L}_{V|Y}^c|]}\right)\right] \leq 2^{-n^{1/2-\delta}},$$

it can be shown that $$\|p_{U_{[n]},Y_{[n]}} - q_{U_{[n]},Y_{[n]}}\| \leq 2^{-n^{1/2-\delta}}.$$

It can be noticed that:

$$2\|p_{U_{[n]},Y_{[n]}} - q_{U_{[n]},Y_{[n]}}\| = \sum_{u_{[n]},y_{[n]}} |p(u_{[n]},y_{[n]}) - q(u_{[n]},y_{[n]})| =$$

-continued $$\sum_{u_{[n]},y_{[n]}} \left| \sum_{s_{[n]}} [p(s_{[n]}, u_{[n]}, y_{[n]}) - q(s_{[n]}, u_{[n]}, y_{[n]})] \right| \leq$$

$$\sum_{s_{[n]},u_{[n]},y_{[n]}} |p(s_{[n]}, u_{[n]}, y_{[n]}) - q(s_{[n]}, u_{[n]}, y_{[n]})| =$$

$$2 \left\| p_{s_{[n]},U_{[n]},Y_{[n]}} - q_{s_{[n]},U_{[n]},Y_{[n]}} \right\|,$$

where the inequality may follow from the triangle inequality. Lemma 7a now completes the proof that $$E_{F_{[|\mathcal{H}_{V|S} \cap \mathcal{L}_{V|Y}^c|]}}[p_e] = O(2^{-n^{1/2-\delta}}).$$

What is claimed is:

1. A method to operate a data device, the method comprising:
   receiving a message m by the data device over a communications channel, the communications channel having a state s, and the data device including a non-volatile memory device;
   processing the message m based on the state s such that multiple binary digits of the processed message m represent a codeword of a block erasure-avoiding code in which the binary digits of the processed message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell; and
   storing the processed message m in memory cells of the non-volatile memory device by, without performing block erasure operations on the memory cells, changing values of at least some of the memory cells from the first logic value to the second logic value,
   wherein the message m is defined by an expression $m_{[|\mathcal{H}_{V|S} \cap \mathcal{L}_{V|Y}|]} \in \{0,1\}^{|\mathcal{H}_{V|S} \cap \mathcal{L}_{V|Y}|}$ and the state s is defined by an expression $s_{[n]} \in \{0,1\}^n$; and
   wherein processing the message m comprises:
      assigning values u to the binary digits of the processed message m according to, for each i from 1 to n:

$$u_i = \begin{cases} u \in \{0,1\} \text{ with probability} \\ p_{U_i|U_{[i-1]},S_{[n]}}(u \mid u_{[i-1]}, s_{[n]}) & \text{if } i \in \mathcal{H}_{V|S}^c \\ m_{r(i,\mathcal{H}_{V|S} \cap \mathcal{L}_{V|Y})} & \text{if } i \in \mathcal{H}_{V|S} \cap \mathcal{L}_{V|Y} \\ f_{r(i,\mathcal{H}_{V|S} \cap \mathcal{L}_{V|Y}^c)} & \text{if } i \in \mathcal{H}_{V|S} \cap \mathcal{L}_{V|Y}^c \end{cases};$$

calculating $v_{[n]} = u_{[n]} G_n$, where $$G_n = G^{\otimes \log_2 n}, \text{ for } G = \begin{pmatrix} 1 & 0 \\ 1 & 1 \end{pmatrix},$$

and $\otimes$ denotes a Kronecker power; and
   storing a value $x_i(v_i, s_i)$, for each $i \in [n]$.

2. The method as in claim 1, wherein storing the processed message m comprises:
   storing a vector u in the data device, where $u_{\mathcal{L}_{V|Y}^c \cap \mathcal{H}_{V|S}^c}$ separately from x, using a linear, non-capacity-achieving polar code with a uniform input distribution.

3. The method of claim 1, further comprising:
   receiving a message y over the communications channel of the data device from the non-volatile memory device, the message y comprising binary digits corresponding to an encoded data value and comprising a vector $y[n] \in \{0,1\}^n$ that represents the encoded data value with a noise term that represents error in the communications channel;
   estimating a vector û that represents the message y decoded, wherein the vector û comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and
   returning the estimated vector û as an estimated original data value that corresponds to an estimated decoded value of the encoded data value of the received message y.

4. The method as in claim 3, wherein estimating the vector û comprises processing the message y to assign values û to the binary digits according to:
   for each i from 1 to n, assign $$\hat{u}_i = \begin{cases} \operatorname{argmax}_{u \in \{0,1\}} p_{U_i|U_{[i-1]},Y_{[n]}}(u \mid u_{[i-1]}, y_{[n]}) & \text{if } i \in \mathcal{L}_{V|Y} \\ \hat{u}_{r(i,\mathcal{L}_{V|Y}^c \cap \mathcal{H}_{V|S}^c)} & \text{if } i \in \mathcal{L}_{V|Y}^c \cap \mathcal{H}_{V|S}^c \\ f_{r(i,\mathcal{L}_{V|Y}^c \cap \mathcal{H}_{V|S})} & \text{if } i \in \mathcal{L}_{V|Y}^c \cap \mathcal{H}_{V|S} \end{cases}.$$

5. The method as in claim 3, wherein returning the estimated vector û comprises returning an estimated message $\hat{m}_{[|\mathcal{H}_{V|S} \cap \mathcal{L}_{V|Y}|]} = \hat{u}_{\mathcal{H}_{V|S} \cap \mathcal{L}_{V|Y}}$.

6. A method to operate a data device, the method comprising:
   receiving a message m by the data device over a communications channel, the communications channel having a state s, and the data device including a non-volatile memory device;
   processing the message m based on the state s such that multiple binary digits of the processed message m represent a codeword of a block erasure-avoiding code in which the binary digits of the processed message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell; and
   storing the processed message m in memory cells of the non-volatile memory device by, without performing block erasure operations on the memory cells, changing values of at least some of the memory cells from the first logic value to the second logic value,
   wherein the message m is defined by an expression $m_{[(|\mathcal{H}_{V|S} \cap \mathcal{L}_{V|Y}| - |\mathcal{H}_{V|S}^c \cap \mathcal{L}_{V|Y}^c|),[k]]} \in \{0,1\}^{k(|\mathcal{H}_{V|S} \cap \mathcal{L}_{V|Y}| - |\mathcal{H}_{V|S}^c \cap \mathcal{L}_{V|Y}^c|)}$ and the state s is defined by an expression $s_{[n],[k]} \in \{0,1\}^{kn}$;
   wherein processing the message m comprises processing the message m to assign values u to the binary digits according to:
   let $u_{[n],0} \in \{0,1\}^n$ be an arbitrary vector; for each j from 1 to k, and for each i from 1 to n, assign $u_{i,j}$ to one of:

$$u_{i,j} = \begin{cases} u \in \{0, 1\} \text{ with probability} \\ \quad p_{U_i|U_{[i-1]},S_{[n]}}(u \mid u_{[i-1]}, s_{[n]}) & \text{if } i \in \mathcal{H}^c_{V|S} \\ m_{r(i;\mathcal{H}_{V|S} \cap \mathcal{L}_{V|Y}),j} & \text{if } i \in (\mathcal{H}_{V|S} \cap \mathcal{L}_{V|Y}) \backslash \mathcal{R} \\ u_{r(i;\mathcal{H}^c_{V|S} \cap \mathcal{L}^c_{V|Y}),j-1} & \text{if } i \in \mathcal{R} \\ f_{r(i;\mathcal{H}_{V|S} \cap \mathcal{L}^c_{V|Y}),j} & \text{if } i \in \mathcal{H}_{V|S} \cap \mathcal{L}^c_{V|Y} \end{cases};$$

and
wherein processing the message m further comprises:
calculating v, where, for each j from 1 to k, v is defined by an expression $v_{[n],j} = u_{[n],j} G_n$, where $$G_n = G^{\otimes \log 2^n}, \text{ for } G = \begin{pmatrix} 1 & 0 \\ 1 & 1 \end{pmatrix},$$

and $\otimes$ denotes a Kronecker power; and
storing a value $x_{i,j}(v_{i,j}, s_{i,j})$, for each $i \in [n]$.

7. The method as in claim 6, wherein storing the processed message m in the data device comprises:
storing a vector $u_{H_V^c \cap L_{[n]}^c,k}$ separately using a non-capacity-achieving polar code with a uniform input distribution.

8. The method as in claim 6, further comprising:
receiving a message y over the communications channel from the non-volatile memory device, the message y comprising binary digits corresponding to an encoded data value and comprising a vector $y[n] \in \{0,1\}^n$ that represents the encoded data value with a noise term that represents error in the communications channel;
estimating a vector $\hat{u}$ that represents the message y decoded, wherein the vector $\hat{u}$ comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and
returning the estimated vector $\hat{u}$ as an estimated original data value that corresponds to an estimated decoded value of the encoded data value of the received message y,
wherein estimating the vector $\hat{u}$ comprises:
letting $\hat{u}_{R,K+1} = \hat{u}_{L_{[n]}^c \cap H_{[n]}^c,k}$; and
estimating $\hat{u}_{[n],[k]}(y_{[n],[k]}, f_{[|L_{[n]}^c \cap H_{[n]}S|],[k]})$ as follows: for each j down from k to 1, and for each i from 1 to n, assign:

$$\hat{u}_i^j = \begin{cases} \operatorname{argmax}_{u \in [0,1]} p_{U_i|U_{[i-1]},Y_{[n]}}(u \mid u_{[i-1],j}, y_{[n],j}) & \text{if } i \in \mathcal{L}_{V|Y} \\ \hat{u}_{r(i,R),j+1} & \text{if } i \in \mathcal{L}^c_{V|Y} \cap \mathcal{H}_{V|S} \\ f_{r(i,\mathcal{L}^c_{V|Y} \cap \mathcal{H}_{V|S}),j} & \text{if } i \in \mathcal{L}^c_{V|Y} \cap \mathcal{H}_{V|S} \end{cases}$$

9. The method as in claim 8, further comprising returning an estimated message $\hat{m}_{[|H_{[n]S} \cap L_{[n]Y}|-|H_{[n]S}^c \cap L_{[n]Y}^c|],[k]} = \hat{u}_{(H_{[n]S} \cap L_{[n]Y}) \backslash R,[k]}$.

10. A memory controller to control memory of a data device having a non-volatile memory device, the memory controller comprising:

an interface configured to receive a message m over a communications channel, the communications channel having a state s; and
a processor coupled to the interface and configured to:
process the message m based on the state s such that multiple binary digits of the message m represent a codeword of a block erasure-avoiding code in which the binary digits of the message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell, and
store the processed message m in memory cells of the non-volatile memory device by, without performing block erasure operations on the memory cells, changing values of at least some of the memory cells from the first logic value to the second logic value,
wherein the message m is defined by an expression $m_{[|H_{[n]S} \cap L_{[n]Y}|]} \in \{0,1\}^{H_{[n]S} \cap L_{[n]Y}}$ and the state s is defined by an expression $s_{[n]} \in \{0,1\}^n$; and
wherein processing the message m comprises:
assigning values u to the binary digits of the processed message m according to, for each i from 1 to n:

$$u_i = \begin{cases} u \in \{0, 1\} \text{ with probability} \\ \quad p_{U_i|U_{[i-1]},S_{[n]}}(u \mid u_{[i-1]}, s_{[n]}) & \text{if } i \in \mathcal{H}^c_{V|S} \\ m_{r(i;\mathcal{H}_{V|S} \cap \mathcal{L}_{V|Y})} & \text{if } i \in \mathcal{H}_{V|S} \cap \mathcal{L}_{V|Y} \\ f_{r(i;\mathcal{H}_{V|S} \cap \mathcal{L}^c_{V|Y})} & \text{if } i \in \mathcal{H}_{V|S} \cap \mathcal{L}^c_{V|Y} \end{cases};$$

calculating $v_{[n]} = u_{[n]} G_n$, where $$G_n = G^{\otimes \log 2^n}, \text{ for } G = \begin{pmatrix} 1 & 0 \\ 1 & 1 \end{pmatrix},$$

and $\otimes$ denotes a Kronecker power; and
storing a value $x_i(v_i, s_i)$, for each $i \in [n]$.

11. The memory controller as in claim 10, wherein the processor is further configured to store a vector u in the data device, where $u_{L_{cV|Y} \cap H_{cV}}$, separately from x, by use of a linear, non-capacity-achieving polar code with a uniform input distribution.

12. The memory controller of claim 10, wherein:
the interface is further configured to receive a message y over the communications channel from the non-volatile memory device, the message y comprising binary digits corresponding to an encoded data value and comprising a vector $y[n] \in \{0, 1\}^n$ that represents the encoded data value with a noise term that represents error in the communications channel;

the processor is further configured to:
- estimate a vector û that represents the message y decoded, wherein the vector û comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and
- return the estimated vector û as an estimated original data value that corresponds to an estimated decoded value of the encoded data value of the received message y.

13. The memory controller as in claim 12, wherein to estimate the vector û, the processor is configured to process the message y to assign values û to the binary digits according to:

for each i from 1 to n, assign $$\hat{u}_i = \begin{cases} \arg\max_{u \in \{0,1\}} p_{U_i|U_{[i-1]},Y_{[n]}}(u \mid u_{[i-1]}, y_{[n]}) & \text{if } i \in \mathcal{L}_{V|Y} \\ \hat{u}_{r(i, \mathcal{L}^c_{V|Y} \cap \mathcal{H}^c_{V|S})} & \text{if } i \in \mathcal{L}^c_{V|Y} \cap \mathcal{H}^c_{V|S} \\ f_{r(i, \mathcal{L}^c_{V|Y} \cap \mathcal{H}_{V|S})} & \text{if } i \in \mathcal{L}^c_{V|Y} \cap \mathcal{H}_{V|S} \end{cases}$$

14. The memory controller as in claim 12, wherein to return the estimated vector û, the processor is configured to return an estimated message $\hat{m}_{[|H_{V|S} \cap L_{V|Y}|]} = \hat{u}_{H_{V|S} \cap L_{V|Y}}$.

15. A memory controller to control memory of a data device having a non-volatile memory device, the memory controller comprising:
- an interface configured to receive a message m over a communications channel, the communications channel having a state s; and
- a processor coupled to the interface and configured to:
  - process the message m based on the state s such that multiple binary digits of the message m represent a codeword of a block erasure-avoiding code in which the binary digits of the message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell, and
  - store the processed message m in memory cells of the non-volatile memory device by, without performing block erasure operations on the memory cells, changing values of at least some of the memory cells from the first logic value to the second logic value, wherein the message m is defined by an expression $\hat{m}_{[(|H_{V|S} \cap L_{V|Y}| - |H_{V|S}^c \cap L_{V|Y}^c|)],[k]} \in \{0,1\}^{k(|H_{V|S} \cap L_{V|Y}| - |H_{V|S}^c \cap L_{V|Y}^c|)}$ and the state s is defined by an expression $s_{[n],[k]} \in \{0,1\}^{kn}$;

wherein the processor is configured to process the message m to assign values u to the binary digits according to:

let $u_{[n],0} \in \{0,1\}^n$ be an arbitrary vector; for each j from 1 to k, and for each i from 1 to n, assign $u_{i,j}$ to one of:

$$u_{i,j} = \begin{cases} u \in \{0,1\} \text{ with probability } p_{U_i|U_{[i-1]},S_{[n]}}(u \mid u_{[i-1]}, s_{[n]}) & \text{if } i \in \mathcal{H}^c_{V|S} \\ m_{r(i, \mathcal{H}_{V|S} \cap \mathcal{L}_{V|Y}),j} & \text{if } i \in (\mathcal{H}_{V|S} \cap \mathcal{L}_{V|Y}) \setminus \mathcal{R} \\ u_{r(i, \mathcal{H}^c_{V|S} \cap \mathcal{L}^c_{V|Y}),j-1} & \text{if } i \in \mathcal{R} \\ f_{r(i, \mathcal{H}_{V|S} \cap \mathcal{L}^c_{V|Y}),j} & \text{if } i \in \mathcal{H}_{V|S} \cap \mathcal{L}^c_{V|Y} \end{cases}$$

and
wherein to process the message m, the processor is further configured to:
- calculate v, where, for each j from 1 to k, v is defined by an expression $v_{[n],j} = u_{[n],j} G_n$, where $$G_n = G^{\otimes \log_2 n}, \text{ for } G = \begin{pmatrix} 1 & 0 \\ 1 & 1 \end{pmatrix},$$

and ⊗ denotes a Kronecker power; and
- store a value $x_{i,j}(v_{i,j}, s_{i,j})$, for each $i \in [n]$.

16. The memory controller as in claim 15, wherein the processor is further configured to store a vector $u_{H_V^c \cap L_{V|Y}^c, k}$ separately by use of a non-capacity-achieving polar code with a uniform input distribution.

17. The memory controller as in claim 15, wherein:
- the interface is further configured to receive a message y over the communications channel of the data device from the non-volatile memory device, the message y comprising binary digits corresponding to an encoded data value and comprising a vector $y[n] \in \{0,1\}^n$ that represents the encoded data value with a noise term that represents error in the communications channel; and
- the processor is further configured to:
  - estimate a vector û that represents the message y decoded, wherein the vector û comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and
  - return the estimated vector û as an estimated original data value that corresponds to an estimated decoded value of the encoded data value of the received message y;

wherein to estimate the vector û, the processor is configured to:
- let $\hat{u}_{R,K+1} = \hat{u}_{L_{V|Y}^c \cap H_{V|S}^c, k}$; and
- estimate $\hat{u}_{[n],[k]}(y_{[n],[k]}, f_{[|L_{V|Y}^c \cap H_{V|S}|],[k]})$ as follows: for each j down from k to 1, and for each i from 1 to n, assign:

$$\hat{u}_i^j = \begin{cases} \arg\max_{u \in \{0,1\}} p_{U_i|U_{[i-1]},Y_{[n]}}(u \mid u_{[i-1],j}, y_{[n],j}) & \text{if } i \in \mathcal{L}_{V|Y} \\ \hat{u}_{r(i, \mathcal{R}),j+1} & \text{if } i \in \mathcal{L}^c_{V|Y} \cap \mathcal{H}^c_{V|S} \\ f_{r(i, \mathcal{L}^c_{V|Y} \cap \mathcal{H}_{V|S}),j} & \text{if } i \in \mathcal{L}^c_{V|Y} \cap \mathcal{H}_{V|S} \end{cases}$$

18. The memory controller as in claim 17, wherein the processor is configured to return an estimated message $\hat{m}_{[|H_{V|S} \cap L_{V|Y}| - |H_{V|S}^c \cap L_{V|Y}^c|],[k]} = \hat{u}_{(H_{V|S} \cap L_{V|Y}) \setminus \mathcal{R}, [k]}$.

19. A data device, comprising:
a non-volatile memory device configured to store data values; and
a memory controller that is coupled to the non-volatile memory device and is configured to:
receive a message m over a communications channel, the communications channel having a state s;
process the message m based on the state s such that multiple binary digits of the processed message m represent a codeword of a block erasure-avoiding code in which the binary digits of the processed message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell; and
store the processed message m in memory cells of the non-volatile memory device by, without performing block erasure operations on the memory cells, changing values of at least some of the memory cells from the first logic value to the second logic value,
wherein the message m is defined by an expression $m_{[|H_{V\cap S}\cap L_{V|Y}|]} \in \{0,1\}^{|H_{V\cap S}\cap L_{V|Y}|}$ and the state s is defined by an expression $s_{[n]} \in \{0,1\}^n$; and
wherein processing the message m comprises:
assigning values u to the binary digits of the processed message m according to, for each i from 1 to n:

$$u_i = \begin{cases} u \in \{0,1\} \text{ with probability} \\ p_{U_i|U_{[i-1]}, S_{[n]}}(u \mid u_{[i-1]}, s_{[n]}) & \text{if } i \in \mathcal{H}^c_{V|S} \\ m_{r(i, \mathcal{H}_{V|S} \cap \mathcal{L}_{V|Y})} & \text{if } i \in \mathcal{H}_{V|S} \cap \mathcal{L}_{V|Y} \\ f_{r(i, \mathcal{H}_{V|S} \cap \mathcal{L}^c_{V|Y})} & \text{if } i \in \mathcal{H}_{V|S} \cap \mathcal{L}^c_{V|Y} \end{cases} ;$$

calculating $v_{[n]} = u_{[n]} G_n$, where $$G_n = G^{\otimes \log 2n}, \text{ for } G = \begin{pmatrix} 1 & 0 \\ 1 & 1 \end{pmatrix},$$

and $\otimes$ denotes a Kronecker power; and
storing a value $x_i(v_i, s_i)$, for each $i \in [n]$.

20. The data device as in claim 19, wherein to store the processed message m, the memory controller is configured to:
store a vector u in the data device, where $u_{\mathcal{L}_{V|Y} \cap \mathcal{H}_{C|V}}$, separately from x, by use of a linear, non-capacity-achieving polar code with a uniform input distribution.

21. The data device of claim 19, wherein:
the memory controller is configured to receive a message y over the communications channel from the non-volatile memory device, the message y comprising binary digits corresponding to an encoded data value and comprising a vector $y[n] \in \{0,1\}^n$ that represents the encoded data value with a noise term that represents error in the communications channel; and
the data device further comprises a processor coupled to the non-volatile memory device and configured to:
estimate a vector û that represents the message y decoded, wherein the vector û comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and
return the estimated vector û as an estimated original data value that corresponds to an estimated decoded value of the encoded data value of the received message y.

22. The data device as in claim 21, wherein to estimate the vector û, the processor is configured to process the message y to assign values û to the binary digits according to:
for each i from 1 to n, assign:

$$\hat{u}_i = \begin{cases} \operatorname{argmax}_{u \in \{0,1\}} p_{U_i|U_{[i-1]}, Y_{[n]}}(u \mid u_{[i-1]}, y_{[n]}) & \text{if } i \in \mathcal{L}_{V|Y} \\ \hat{u}_{r(i, \mathcal{L}^c_{V|Y} \cap \mathcal{H}^c_{V|S})} & \text{if } i \in \mathcal{L}^c_{V|Y} \cap \mathcal{H}^c_{V|S} \\ f_{r(i, \mathcal{L}^c_{V|Y} \cap \mathcal{H}_{V|S})} & \text{if } i \in \mathcal{L}^c_{V|Y} \cap \mathcal{H}_{V|S} \end{cases} .$$

23. The data device as in claim 21, wherein to return the estimated vector û, the processor is configured to return an estimated message $\hat{m}_{[|H_{V\cap S}\cap L_{V|Y}|]} = \hat{u}_{H_{V\cap S}\cap L_{V|Y}}$.

24. A data device, comprising:
a non-volatile memory device configured to store data values; and
a memory controller that is coupled to the non-volatile memory device and is configured to:
receive a message m over a communications channel, the communications channel having a state s;
process the message m based on the state s such that multiple binary digits of the processed message m represent a codeword of a block erasure-avoiding code in which the binary digits of the processed message m represent multiple memory cells of the non-volatile memory device such that, after a value of a memory cell is changed from a first logic value to a second logic value, the value of the memory cell remains at the second logic value, regardless of subsequently received messages, until a block erasure operation on the memory cell; and
store the processed message m in memory cells of the non-volatile memory device by, without performing block erasure operations on the memory cells, changing values of at least some of the memory cells from the first logic value to the second logic value,
wherein the message m is defined by an expression $m_{[(|H_{V\cap S}\cap L_{V|Y}| - |H^c_{V\cap S}\cap L^c_{V|Y}|],[k]]} \in \{0,1\}^{k(|H_{V\cap S}\cap L_{V|Y}| - |H^c_{V\cap S}\cap L^c_{V|Y}|)}$ and the state s is defined by an expression $s_{[n],[k]} \in \{0,1\}^{kn}$; and
wherein to process the message m, the memory controller is configured to process the message m to assign values u to the binary digits according to:
let $u_{[n],0} \in \{0,1\}^n$ be an arbitrary vector; for each j from 1 to k, and for each i from 1 to n, assign $u_{i,j}$ to one of:

$$u_{i,j} = \begin{cases} u \in \{0,1\} \text{ with probability} \\ p_{U_i|U_{[i-1]}, S_{[n]}}(u \mid u_{[i-1]}, s_{[n]}) & \text{if } i \in \mathcal{H}^c_{V|S} \\ m_{r(i, \mathcal{H}_{V|S} \cap \mathcal{L}_{V|Y}), j} & \text{if } i \in (\mathcal{H}_{V|S} \cap \mathcal{L}_{V|Y}) \setminus \mathcal{R} \\ u_{r(i, \mathcal{H}^c_{V|S} \cap \mathcal{L}^c_{V|Y}), j-1} & \text{if } i \in \mathcal{R} \\ f_{r(i, \mathcal{H}_{V|S} \cap \mathcal{L}^c_{V|Y}), j} & \text{if } i \in \mathcal{H}_{V|S} \cap \mathcal{L}^c_{V|Y} \end{cases}$$

calculate v, where, for each j from 1 to k, v is defined by an expression $v_{[n],j} = u_{[n],j} G_n$, where $$G_n = G^{\otimes \log_2 n}, \text{ for } G = \begin{pmatrix} 1 & 0 \\ 1 & 1 \end{pmatrix},$$

and $\otimes$ denotes a Kronecker power; and store a value $x_{i,j}(v_{i,j}, s_{i,j})$, for each $i \in [n]$.

25. The data device as in claim 24, wherein to store the processed message m in the data device, the memory controller is configured to:

store a vector $u_{H_V^c \cap L_{V|Y}^c, k}$ separately by use of a non-capacity-achieving polar code with a uniform input distribution.

26. The data device as in claim 24, wherein:

the memory controller is configured to receive a message y over the communications channel from the non-volatile memory device, the message y comprising binary digits corresponding to an encoded data value and comprising a vector $y[n] \in \{0, 1\}^n$ that represents the encoded data value with a noise term that represents error in the communications channel; and the data device further comprises a processor coupled to the non-volatile memory device and configured to:

estimate a vector û that represents the message y decoded, wherein the vector û comprises a codeword of a block erasure-avoiding code in which binary digits of the message y are represented by a codeword configured for representation by multiple memory cells of the data device such that, after a value of a memory cell is changed from logic "0" to logic "1", the value of that memory cell remains at logic "1", even if a corresponding stored data value is later changed; and return the estimated vector û as an estimated original data value that corresponds to an estimated decoded value of the encoded data value of the received message y; and the processor is configured to:

let $\hat{u}_{R,K+1} = \hat{u}_{L_{V|Y}^c \cap H_{V|S}^c, k}$; and estimate $\hat{u}_{[n],[k]}(y_{[n],[k]}, f_{[|L_{V|Y}^c \cap H_{V|S}|],[k]})$ as follows: for each j down from k to 1, and for each i from 1 to n, assign:

$$\hat{u}_i^j = \begin{cases} \operatorname{argmax}_{u \in \{0,1\}} p_{U_i|U_{[i-1]},Y_{[n]}}(u \mid u_{[i-1],j}, y_{[n],j}) & \text{if } i \in \mathcal{L}_{V|Y} \\ \hat{u}_{r(i,R),j+1} & \text{if } i \in \mathcal{L}_{V|Y}^c \cap \mathcal{H}_{V|S}^c \\ f_{r(i, \mathcal{L}_{V|Y}^c \cap \mathcal{H}_{V|S}),j} & \text{if } i \in \mathcal{L}_{V|Y}^c \cap \mathcal{H}_{V|S} \end{cases}$$

27. The data device as in claim 26, wherein the processor is configured to return an estimated message $\hat{m}_{[|H_{V|S} \cap L_{V|Y}| - |H_{V|S}^c \cap L_{V|Y}^c|],[k]} = \hat{u}_{(H_{V|S} \cap L_{V|Y}) \setminus R, [k]}$.

* * * * *